United States Patent
Cheng et al.

(10) Patent No.: US 12,183,274 B2
(45) Date of Patent: *Dec. 31, 2024

(54) DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Yudiao Cheng, Beijing (CN); Benlian Wang, Beijing (CN); Meng Li, Beijing (CN); Weiyun Huang, Beijing (CN); Yao Huang, Beijing (CN)

(73) Assignees: Chengdu BOE Optoelectronics Technology Co., Ltd., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/477,479

(22) Filed: Sep. 28, 2023

(65) Prior Publication Data

US 2024/0029647 A1    Jan. 25, 2024

Related U.S. Application Data

(63) Continuation of application No. 17/433,292, filed as application No. PCT/CN2020/124401 on Oct. 28, 2020, now Pat. No. 11,810,504.

(30) Foreign Application Priority Data

Sep. 30, 2020    (WO) ................ PCT/CN2020/119673

(51) Int. Cl.
*G09G 3/3225*    (2016.01)
*G09G 3/3233*    (2016.01)
(Continued)

(52) U.S. Cl.
CPC ......... *G09G 3/3225* (2013.01); *G09G 3/3233* (2013.01); *G09G 3/3275* (2013.01);
(Continued)

(58) Field of Classification Search
CPC .... H10K 59/1216; H10K 71/00; H10K 59/65; H10K 59/1213; H10K 59/131;
(Continued)

(56) References Cited

U.S. PATENT DOCUMENTS 10,707,281 B2    7/2020    Kuo et al.
10,733,931 B2    8/2020    Jung et al.
(Continued)

FOREIGN PATENT DOCUMENTS

CN        106469743 A    3/2017
CN        107610635 A    1/2018
(Continued)

OTHER PUBLICATIONS

WIPO, ISR of PCT/CN2020/119673 ISR dated Jun. 23, 2021.
(Continued)

*Primary Examiner* — Nelson M Rosario
*Assistant Examiner* — Scott D Au
(74) *Attorney, Agent, or Firm* — HOUTTEMAN LAW LLC

(57) ABSTRACT

The present disclosure provides display substrate and display device, and belongs to the field of display technology. The display substrate of the disclosure has mounting region, first display region adjacent to mounting region, and second display region surrounding first display region and/or mounting region. The display substrate comprises: substrate; driving circuit layer on substrate and comprising pixel driving circuits in first display region and second display region, and arrangement density of pixel driving circuits in second display region is less than that of pixel driving
(Continued)

circuits in second display region; and light emitting devices in mounting region, first display region, and second display region, first electrode of each light emitting device being electrically coupled to a corresponding pixel driving circuit, and pixel driving circuit electrically coupled to first electrode of light emitting device in the mounting region being located in first display region.

20 Claims, 12 Drawing Sheets

(51) Int. Cl.
| | |
|---|---|
| G09G 3/3275 | (2016.01) |
| H10K 50/86 | (2023.01) |
| H10K 59/121 | (2023.01) |
| H10K 59/131 | (2023.01) |
| H10K 59/35 | (2023.01) |
| H10K 59/65 | (2023.01) |
| H10K 59/88 | (2023.01) |
| H10K 71/00 | (2023.01) |
| H10K 59/12 | (2023.01) |

(52) U.S. Cl.
CPC ......... H10K 50/865 (2023.02); H10K 59/121 (2023.02); H10K 59/1213 (2023.02); H10K 59/1216 (2023.02); H10K 59/131 (2023.02); H10K 59/351 (2023.02); H10K 59/65 (2023.02); H10K 59/88 (2023.02); H10K 71/00 (2023.02); H10K 71/621 (2023.02); *G09G 2300/0413* (2013.01); *G09G 2300/0426* (2013.01); *G09G 2300/0819* (2013.01); *G09G 2300/0842* (2013.01); *G09G 2310/0272* (2013.01); *G09G 2310/08* (2013.01); *H10K 59/1201* (2023.02); *H10K 59/353* (2023.02)

(58) Field of Classification Search
CPC .... H10K 59/121; H10K 59/00; H10K 50/865; H10K 59/88; H10K 59/351; H10K 71/621; H10K 59/353; H10K 59/1201; G09G 3/3275; G09G 3/3225; G09G 3/3233; G09G 2354/00; G09G 2300/0452; G09G 2300/0819; G09G 2300/0426; G09G 2300/0842; G09G 2300/0413; G09G 2310/08; G09G 2310/0272; G09G 2340/0407
See application file for complete search history.

(56) References Cited

U.S. PATENT DOCUMENTS

| | | | |
|---|---|---|---|
| 10,756,136 | B1 | 8/2020 | Ma et al. |
| 10,854,124 | B2 | 12/2020 | Yang et al. |
| 11,048,294 | B2 | 6/2021 | Yin et al. |
| 11,114,032 | B2 | 9/2021 | Bian |
| 11,183,544 | B2 | 11/2021 | Zhang |
| 11,227,538 | B2 | 1/2022 | Yang et al. |
| 11,727,849 | B2 | 8/2023 | Lu et al. |
| 11,810,505 | B2 * | 11/2023 | Lee ..................... G09G 3/3225 |
| 11,847,964 | B2 | 12/2023 | Huang et al. |
| 11,862,081 | B2 | 1/2024 | Cheng et al. |
| 2009/0179838 | A1 | 7/2009 | Yamashita et al. |
| 2013/0083080 | A1 | 4/2013 | Rappoport et al. |
| 2016/0358576 | A1 | 12/2016 | Lee et al. |
| 2017/0162111 | A1 | 6/2017 | Kang et al. |
| 2017/0200777 | A1 | 7/2017 | Li et al. |
| 2018/0166017 | A1 | 6/2018 | Li et al. |
| 2018/0219058 | A1 | 8/2018 | Xiang et al. |
| 2018/0293936 | A1 | 10/2018 | Fujioka |
| 2018/0308417 | A1 | 10/2018 | Xie et al. |
| 2018/0366066 | A1 | 12/2018 | Kim et al. |
| 2019/0004354 | A1 | 1/2019 | Hsiao |
| 2019/0096962 | A1 | 3/2019 | Han et al. |
| 2020/0052048 | A1 | 2/2020 | Kuo et al. |
| 2020/0075697 | A1 | 3/2020 | Xu et al. |
| 2020/0105187 | A1 | 4/2020 | Bian |
| 2020/0194512 | A1 | 6/2020 | Wang |
| 2020/0194532 | A1 | 6/2020 | Lee et al. |
| 2020/0251539 | A1 | 8/2020 | Fu |
| 2020/0258441 | A1 | 8/2020 | Zhang et al. |
| 2020/0312209 | A1 | 10/2020 | Yang et al. |
| 2020/0411610 | A1 | 12/2020 | Zhang |
| 2021/0043135 | A1 | 2/2021 | Zhao et al. |
| 2021/0090501 | A1 | 3/2021 | Wu et al. |
| 2021/0132767 | A1 | 5/2021 | Wang et al. |
| 2021/0134936 | A1 | 5/2021 | Chang et al. |
| 2021/0158750 | A1 | 5/2021 | Xiang et al. |
| 2021/0327972 | A1 | 10/2021 | Lou et al. |
| 2021/0351255 | A1 | 11/2021 | Chang et al. |
| 2021/0376047 | A1 | 12/2021 | Xue et al. |
| 2022/0069047 | A1 | 3/2022 | Yang et al. |
| 2022/0093682 | A1 | 3/2022 | Chang et al. |
| 2022/0189394 | A1 | 6/2022 | Yang |
| 2022/0293692 | A1 | 9/2022 | Xu et al. |
| 2022/0343862 | A1 | 10/2022 | Cheng et al. |
| 2022/0376000 | A1 | 11/2022 | Du et al. |
| 2022/0376015 | A1 | 11/2022 | Cheng et al. |
| 2023/0410719 | A1 | 12/2023 | Park et al. |

FOREIGN PATENT DOCUMENTS

| | | | | |
|---|---|---|---|---|
| CN | 107610645 | A | 1/2018 | |
| CN | 108010947 | A | 5/2018 | |
| CN | 207425860 | U | 5/2018 | |
| CN | 108365123 | A | 8/2018 | |
| CN | 108389879 | A | 8/2018 | |
| CN | 108445684 | A | 8/2018 | |
| CN | 108922482 | A | 11/2018 | |
| CN | 109037287 | A | 12/2018 | |
| CN | 109671759 | A | 4/2019 | |
| CN | 109742128 | A | 5/2019 | |
| CN | 109801950 | A | 5/2019 | |
| CN | 109904214 | A | 6/2019 | |
| CN | 109950288 | A | 6/2019 | |
| CN | 110061014 | A | 7/2019 | |
| CN | 110232892 | A | 9/2019 | |
| CN | 110265455 | A | 9/2019 | |
| CN | 110379356 | A | 10/2019 | |
| CN | 110459175 | A | 11/2019 | |
| CN | 110603578 | A | 12/2019 | |
| CN | 110634930 | A | 12/2019 | |
| CN | 209731298 | U * | 12/2019 | ............. H04M 1/02 |
| CN | 110767157 | A | 2/2020 | |
| CN | 110767174 | A | 2/2020 | |
| CN | 110767681 | A | 2/2020 | |
| CN | 110767720 | A | 2/2020 | |
| CN | 110825264 | A | 2/2020 | |
| CN | 110874990 | A | 3/2020 | |
| CN | 110890026 | A | 3/2020 | |
| CN | 110969982 | A | 4/2020 | |
| CN | 111048005 | A | 4/2020 | |
| CN | 210245501 | A | 4/2020 | |
| CN | 111180483 | A | 5/2020 | |
| CN | 111180494 | A | 5/2020 | |
| CN | 111211152 | A | 5/2020 | |
| CN | 210515985 | U | 5/2020 | |
| CN | 111261677 | A | 6/2020 | |
| CN | 111261684 | A | 6/2020 | |
| CN | 111326560 | A | 6/2020 | |
| CN | 111402743 | A | 7/2020 | |
| CN | 111446282 | A | 7/2020 | |
| CN | 111508377 | A | 8/2020 | |
| CN | 111725287 | A | 9/2020 | |
| EP | 3176772 | A | 6/2017 | |
| JP | 2016001303 | A | 1/2016 | |
| JP | 2018180110 | A | 11/2018 | |
| JP | 2020038758 | A | 3/2020 | |

(56) References Cited

FOREIGN PATENT DOCUMENTS

| WO | WO2018196149 A1 | 11/2018 |
|---|---|---|
| WO | WO2020049811 A1 | 3/2020 |
| WO | WO2021016926 A1 | 2/2021 |

OTHER PUBLICATIONS

WIPO, ISR of PCT-CN2020-127186 dated Jul. 6, 2021.
WIPO, ISR of PCT-CN2020-127256 dated Jul. 6, 2021.
WIPO, ISR of PCT-CN2021-080494 dated Jun. 15, 2021.
China Patent Office, First Office Action dated Apr. 3, 2023, for corresponding Chinese application 202211413382.1.
USPTO, First office action dated Apr. 11, 2023, for corresponding U.S. Appl. No. 17/609,878.
WIPO, International search report of PCT-CN2022-071427, Mar. 2, 2022.
WIPO, International Search report of PCT-CN2020-124401.
China Patent Office, the first office action of CN202080002535.6 issued on Dec. 12, 2022.
China Patent Office, the second office action of CN202080002535.6 issued on Jun. 29, 2023.
Indian Patent Office, the first office action of IN application of 202347024644 issued on Aug. 3, 2023.
USPTO, the Notice of Allowance of U.S. Appl. No. 17/609,878 issued on Aug. 17, 2023.
USPTO, the Notice of Allowance of U.S Appl. No. 17/789,007 issued on Aug. 1, 2023.
USPTO, Notice of Allowance for U.S. Appl. No. 17/433,292 issued on Jun. 28, 2023.
USPTO, first Office action, U.S. Appl. No. 17/423,885, issued Feb. 15, 2024.
USPTO, first Office action U.S. Appl. No. 17/427,151, issued Mar. 14, 2024.
USPTO, First Office Action, dated Jun. 4, 2024, U.S. Appl. No. 18/385,071.
USPTO, Notice of Allowance dated Jun. 12, 2024, U.S. Appl. No. 17/423,885.
USPTO, Notice of Allowance dated Jul. 1, 2024, U.S. Appl. No. 17/427,151.
Japan Patent Office, First Office Action, dated Jul. 22, 2024, JP Appl'n 2023-518291.
Korean Patent Office, First Office Action, dated Jul. 22, 2024, KR Appl'n 10-2023-7009296.
USPTO, Corrected Notice of Allowance, dated Jul. 31, 2024, U.S. Appl. No. 17/427,151.
USPTO, First Office Action, dated Aug. 6, 2024, U.S. Appl. No. 18/489,382.

\* cited by examiner

DISPLAY SUBSTRATE AND DISPLAY DEVICE

TECHNICAL FIELD

The present disclosure relates to the field of display technology, and particularly relates to a display substrate and a display device.

BACKGROUND

With the advance of science and technology, special-shaped screens and full-screen screens have gradually come into people's vision in recent years. The special-shaped screens and the full-screen screens are adopted to improve the screen-to-body ratio of the display device. Then, in order to achieve a higher screen-to-body ratio, some open regions (e.g., holes) need to be reserved for some additional components (e.g., cameras, sensors, etc.) at some locations on the display screen.

With the development and update of display technologies, the organic light emitting display (OLED) has become a mainstream product in the display field due to its characteristics such as self-luminescence, high brightness, high contrast, low operating voltage, and capability of forming flexible displays.

SUMMARY

The present disclosure aims to solve at least one of the technical problems in the prior art and provides a display substrate and a display device.

An embodiment of the present disclosure provides a display substrate having a mounting region, a first display region adjacent to the mounting region, and a second display region surrounding the first display region and/or the mounting region, wherein, the display substrate includes:

a substrate;

a driving circuit layer on the substrate and including a plurality of pixel driving circuits, the plurality of pixel driving circuits being in the first display region and the second display region, and an arrangement density of the pixel driving circuits in the second display region is less than that of the pixel driving circuits in the second display region; and a plurality of light emitting devices in the mounting region, the first display region, and the second display region, a first electrode of each light emitting device being electrically coupled to a corresponding one of the pixel driving circuits, and the pixel driving circuit electrically coupled to the first electrode of the light emitting device in the mounting region being located in the first display region.

In an embodiment, the display substrate further includes:

a plurality of data lines in the first display region and the second display region, each pixel driving circuit being electrically coupled to a corresponding one of the data lines;

wherein in the first display region, a distance between nodes at which two pixel driving circuits adjacent in a first direction are respectively coupled to corresponding data lines is d1; in the second display region, a distance between nodes at which two pixel driving circuits adjacent in the first direction are respectively coupled to corresponding data lines is d2; and d1 is less than d2.

In an embodiment, the plurality of light emitting devices includes a plurality of light emitting device groups arranged along the first direction, the light emitting devices in each of the plurality of light emitting device groups are arranged along a second direction; and the pixel driving circuits coupled to the first electrodes of the light emitting devices in a same light emitting device group are coupled to a same data line.

In an embodiment, at least part of the plurality of data lines includes portions in different layers.

In an embodiment, at least part of the plurality of data lines includes a bend line.

In an embodiment, at least one of the data lines which is the bend line is a first data line; the first data line includes a first sub data line segment directly coupled to the pixel driving circuit for driving at least part of the light emitting devices in the mounting region, and a second sub data line segment directly coupled to the pixel driving circuit for driving at least part of the light emitting devices in the second display region; and at least portions of the first sub data line segment and the second sub data line segment are not on a same straight line.

In an embodiment, the first data line further includes a third sub data line segment directly coupled to the pixel driving circuit for driving at least part of the light emitting devices in the first display region; and at least portions of the first sub data line segment and the third sub data line segment are not on a same straight line.

In an embodiment, the first sub data line segment includes a portion that is substantially in parallel with the second and third sub data line segments.

In an embodiment, the first and second sub data line segments include different materials, and/or the first and third sub data line segments include different materials.

In an embodiment, the second sub data line segment includes a first portion and a second portion respectively disposed at two opposite sides of the mounting region along a second direction; the first data line further includes a first transfer electrode and a second transfer electrode respectively arranged at the two opposite sides of the mounting region along the second direction, and the first sub data line segment is electrically coupled, on a first side of the mounting region along the second direction, to the first portion of the second sub data line segment through the first transfer electrode; and the first sub data line segment is electrically coupled, on a second side of the mounting region along the second direction, to the second portion of the second sub data line segment through the second transfer electrode.

In an embodiment, the first and second transfer electrodes include portions which are substantially in parallel with each other.

In an embodiment, a length of at least part of the first transfer electrode along the first direction is substantially the same as a length of at least part of the second transfer electrode along the first direction.

In an embodiment, the display substrate further includes:

a second conductive layer on the substrate and including the first and second transfer electrodes extending in the first direction;

a second insulating layer on a side of the second conductive layer away from the substrate;

a third conductive layer on a side of the second insulating layer away from the second conductive layer and including the first sub data line segment, the second sub data line segment, and the third sub data line segment extending along a second direction.

In an embodiment, the pixel driving circuits in the first display region include a plurality of first pixel driving circuit groups arranged in a first direction; the pixel driving circuits in the second display region include a plurality of second pixel driving circuit groups arranged along the first direction; the plurality of first pixel driving circuit groups each include a plurality of first pixel driving circuits arranged in a second direction, and the plurality of second pixel driving circuit groups each include a plurality of first pixel driving circuits arranged in the second direction;
  the plurality of light emitting devices constitute a plurality of light emitting device groups arranged in the first direction, and the light emitting devices in each of the plurality of light emitting device groups are arranged in the second direction; and the plurality of light emitting device groups include M mounting-region light emitting device groups, at least one light emitting device of each mounting-region light emitting device group being located in the mounting region;
  the plurality of first pixel driving circuit groups include M first sub-pixel driving circuit groups, the pixel driving circuits in each of the M first sub-pixel driving circuit groups are arranged along the second direction; and M is an integer greater than or equal to 2; and
  the first electrode of the at least one light emitting device of an i-th mounting-region light emitting device group in the mounting region is coupled to the pixel driving circuits in an i-th first sub-pixel driving circuit group in a one-to-one correspondence by signal connection lines, and i has a value from 1 to M.

In an embodiment, the first display region includes a first sub display region and a second sub display region which are oppositely arranged in the first direction; the first sub-pixel driving circuit groups are arranged in the first sub-display region and the second sub-display region; and a ratio of the closest distance from at least one first sub-pixel driving circuit group located in the first sub-display region to an edge of the mounting region, to the closest distance from at least one first sub-pixel driving circuit group located in the second sub-display region to an edge of the mounting region ranges from 0.8 to 1.2.

In an embodiment, a 1st to an M-th light emitting device groups are sequentially arranged in a direction from the first sub display region towards the second sub display region; a 1st to an (M/2)-th first sub-pixel driving circuit groups are in the first sub-display region and are sequentially arranged in the first direction along a direction away from the mounting region; an M-th to an (M/2+1)-th first sub-pixel driving circuit groups are in the second sub-display region and are sequentially arranged in the first direction along the direction away from the mounting region.

In an embodiment, the display substrate further includes: a second conductive layer on the substrate; and the second conductive layer includes a reset power signal line, a first plate of a storage capacitor and the signal connection lines correspondingly coupled to the pixel driving circuits in the 1st and M-th first sub-pixel driving circuit groups.

In an embodiment, the display substrate further includes:
  an active semiconductor layer, including a channel region and a source/drain doped region of each transistor of each of the plurality of pixel driving circuits, and the plurality of pixel driving circuit each at least including a driving transistor, a data writing transistor, a storage capacitor, a threshold compensation transistor, a first reset transistor, a second reset transistor, a first light emission control transistor and a second light emission control transistor;
  a gate insulating layer on a side of the active semiconductor layer away from the substrate;
  a first conductive layer on a side of the gate insulating layer away from the active semiconductor layer, the first conductive layer including a second plate of the storage capacitor, a scan signal line, a reset control signal line, a light emission control signal line, and control electrodes of the driving transistor, the data writing transistor, the threshold compensation transistor, the first light emission control transistor, the second light emission control transistor, the first reset transistor, and the second reset transistor, the control electrode of the driving transistor being reused as the second plate of the storage capacitor;
  a first insulating layer on a side of the first conductive layer away from the gate insulating layer, the second conductive layer being on a side of the first insulating layer away from the first conductive layer;
  a second insulating layer on a side of the second conductive layer away from the first insulating layer; and
  a third conductive layer on a side of the second insulating layer away from the second conductive layer, the third conductive layer including a first power signal line, at least part of data lines and a first sub-transfer part; the first sub-transfer part being electrically coupled to a second electrode of the second light emission control transistor.

In an embodiment, the first display region further includes a third sub-display region and a fourth sub-display region oppositely disposed in the second direction; in the third sub-display region and the fourth sub-display region, a distance between reset control signal lines to which two adjacent pixel driving circuits in the second direction are coupled is d3; in the second display region, a distance between reset power supply signal lines to which two adjacent pixel driving circuits in the second direction are coupled is d4, and d3 is smaller than d4.

In an embodiment, the display substrate further includes:
  a transparent conductive layer, at least including the first electrode of the light emitting device in the mounting region, and the signal connection lines correspondingly coupled to the pixel driving circuits in at least some first sub-pixel driving circuit groups among a 2nd to an (M−1)-th first sub-pixel driving circuit groups.

In an embodiment, the first sub-pixel driving circuit groups are uniformly arranged along the first direction in the first sub-display region and the second sub-display region.

In an embodiment, the display substrate further has a transition region surrounding the first display region and located between the first display region and the second display region; the plurality of light emitting devices include a light emitting device in the transition region, and a pixel driving circuit to which the first electrode of the light emitting device located in the transition region is coupled is located in the first display region.

In an embodiment, the display substrate further includes: a pixel defining layer on the substrate, the pixel defining layer including pixel openings in one-to-one correspondence with the first electrodes of the plurality of light emitting devices;
  in the first display region, sizes of the pixel openings corresponding to the first electrodes of the light emitting devices emitting light with a same color are substantially the same, in the second display region, sizes of the pixel openings corresponding to the first electrodes of the light emitting devices emitting light with a same color are substantially the same, and in the mounting region, sizes of the pixel openings corresponding to the first electrodes of the light emitting devices emitting light with a same color are substantially the same; and among the pixel openings corresponding to the first electrodes of the light emitting devices emitting light with the same color, the size of each pixel opening in the mounting region is not larger than the sizes of the pixel openings in the first display region and the second display region.

In an embodiment, among the light emitting devices in the mounting region, the first display region, and the second display region, the pixel driving circuits for the light emitting devices in a same region and arranged in a second direction are arranged in the second direction.

In an embodiment, a ratio of an area of a pattern of an active semiconductor layer in the first display region to an area of the first display region is larger than a ratio of an area of a pattern of an active semiconductor layer in the second display region to an area of the second display region.

In an embodiment, ratios of respective light emission areas of at least two of the first display region, the second display region, and the mounting region to respective total areas of the at least two of the first display region, the second display region, and the mounting region are different from each other.

In an embodiment, in the first display region, a width of the pixel driving circuit in a first direction is less than a width of the light emitting device in the first direction.

In an embodiment, in the first display region, a difference between a width of the pixel driving circuit in the first direction and a width of any one of the plurality of light emitting devices in the first direction is about 3 μm to about 5 μm.

The present disclosure further provides a display device, including the display substrate as described above.

In an embodiment, the display device further includes: a photosensitive sensor, and an orthographic projection of the photosensitive sensor on the substrate is in the mounting region.

In an embodiment, the mounting region is rectangular, and an area of the orthographic projection of the photosensitive sensor on the substrate is equal to or smaller than an area of an inscribed circle of the second display region.

DETAIL DESCRIPTION OF EMBODIMENTS

In order to make those skilled in the art better understand the technical solutions of the present disclosure, the present disclosure is further described in detail below with reference to the accompanying drawings and the detailed description.

Unless defined otherwise, technical or scientific terms used in the present disclosure shall have the ordinary meaning as understood by one of ordinary skill in the art to which the present disclosure belongs. The terms "first," "second," and the like as used in the present disclosure are not intended to indicate any order, quantity, or importance, but rather to distinguish one element from another. Also, the term "a," "an," or "the" and similar term do not denote a limitation of quantity, but rather denote the presence of at least one. The term "include" or "comprise", or the like, mean that the element or item preceding the term includes the element or item listed after the term and its equivalent, but do not exclude other elements or items. The term "connected", "coupled" or the like are not restricted to physical or mechanical connections, but may include electrical connections, whether direct or indirect. The terms "upper", "lower", "left", "right", or the like are used only to indicate relative positional relationships, and when the absolute position of the object being described is changed, the relative positional relationships may also be changed accordingly.

With the development of display technology, the design of a screen with a notch at the top is gradually unable to satisfy the demand of the user for the high screen-to-body ratio of the display panel, and a series of display panels that can realize display in the mounting region emerge at the right moment. In this kind of display panels, the hardware such as a photosensitive sensor (for example, a camera) can be set up in the mounting region. Because there is no need to punch holes, a true full screen is possible under the premise of ensuring the practicability of the display panel.

An embodiment of the disclosure provides a display substrate, and a display panel applied with the display substrate does not reduce the number of pixels in a display region and ensures a better display effect of the display region on the premise of ensuring reliable driving of light emitting devices D in the mounting region and better light transmittance of the mounting region.

Figure 1:
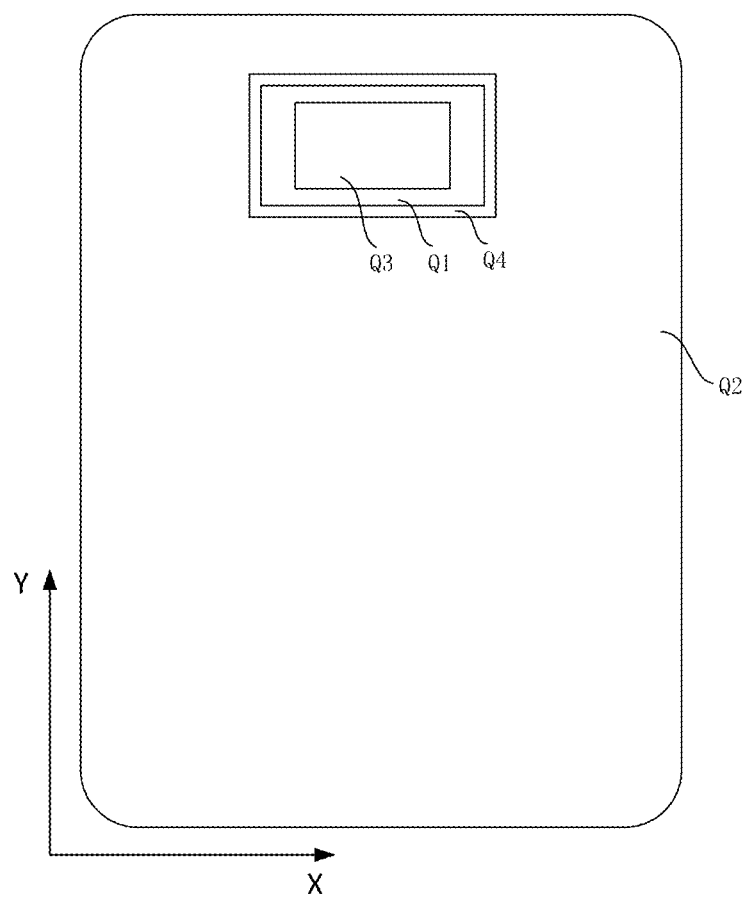
FIG. 1 is a schematic distribution diagram of regions of a display substrate.

FIG. 1 is a schematic distribution diagram of regions of a display substrate. As shown in FIG. 1, the display substrate has a mounting region Q3, a first display region Q1 surrounding the mounting region Q3, a transition region Q4 surrounding the first display region Q1, and a second display region Q2 surrounding the transition region Q4. In an embodiment, the light emitting devices D are disposed in the mounting region Q3, the transition region Q4, the first display region Q1, and the second display region Q2 of the display substrate, and not only the light emitting devices D but also pixel driving circuits 10 for supplying driving signals to the light emitting devices D are disposed in the first display region Q1 and the second display region Q2. Since the mounting region Q3 needs to be provided with a photosensitive sensor while performing display, the light emitting devices D having a certain transmittance are selected as the light emitting devices D in the mounting region Q3. For example, the mounting region Q3 is not provided with the pixel driving circuits 10, and the pixel driving circuits 10 of the light emitting devices D in the mounting region Q3 may be disposed in the first display region Q1 and/or the second display region Q2 (hereinafter, the expression "the pixel driving circuit(s) of the light emitting device(s)" means that the pixel driving circuit(s) for driving the light emitting device(s)). In order to facilitate electrical connection between the light emitting devices D in the mounting region Q3 and the pixel driving circuits 10 thereof, the pixel driving circuits 10 of the light emitting devices D in the mounting region Q3 are disposed in the first display region Q1 in some embodiments. In some embodiments, since the pixel driving circuits 10 of the light emitting devices D in the mounting region Q3 are disposed in the first display region Q1, in order to facilitate the wiring of the signal lines (e.g., data lines Vd) to which these pixel driving circuits 10 are coupled, only the light emitting devices D may be disposed in the transition region Q4 without the pixel driving circuits 10, and the pixel driving circuits 10 of the light emitting devices D in the transition region Q4 may be disposed in the first display region Q1 and/or the second display region Q2. In order to facilitate electrical connection between the light emitting devices D in the transition region Q4 and the pixel driving circuits 10 thereof, the pixel driving circuits 10 of the light emitting devices D in the transition region Q4 are also disposed in the first display region Q1 in some embodiments.

It should be noted that, in practice, the first display region Q1 is not limited to be disposed around the mounting region, and if the mounting region Q3 is at a corner, the first display region Q1 is adjacent to only a part of the sides of the mounting region Q3. For example, the first display region Q1 surrounds two or three sides of the mounting region Q3. In an embodiment of the present disclosure, the explanation is given by taking a case where the first display region Q1 surrounds the mounting region Q3, the transition region Q4 surrounds the first display region Q1, and the second display region Q2 surrounds the transition region as an example. Of course, the mounting region may be adjacent to the first display region Q1, and the transition region Q4 may be located between the first display region Q1 and the second display region Q2.

Figure 2:
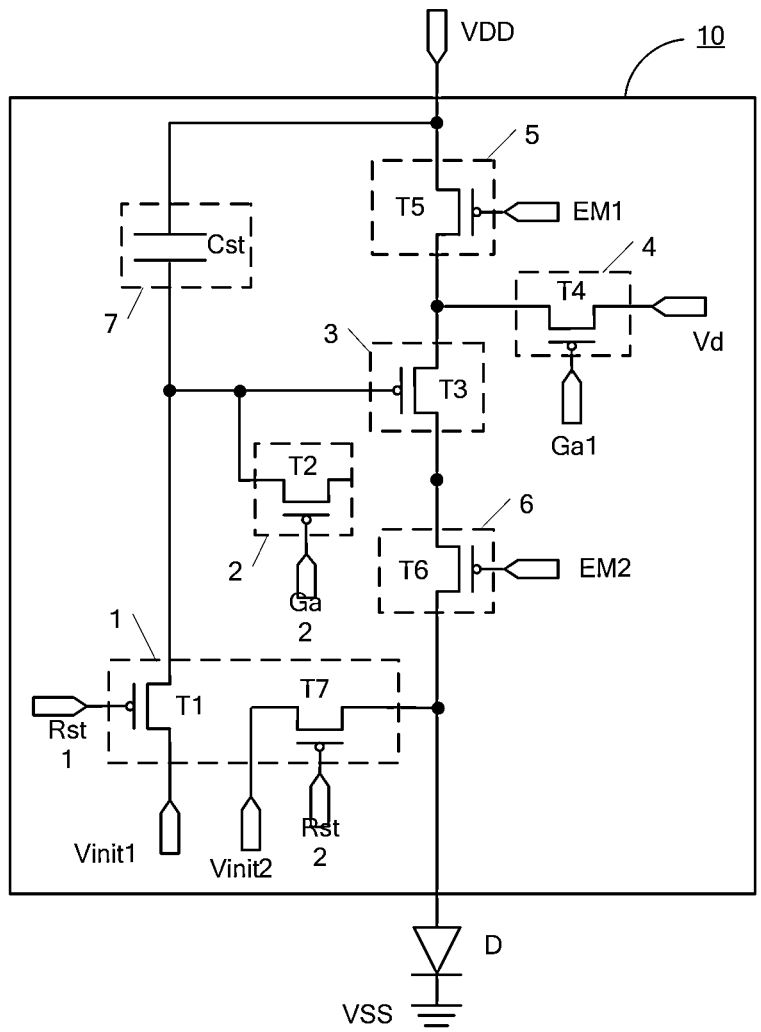
FIG. 2 is a schematic diagram of a pixel driving circuit.

FIG. 2 is a schematic diagram of a pixel driving circuit 10. As shown in FIG. 2, the pixel driving circuit 10 may include: a reset sub-circuit 1, a threshold compensation sub-circuit 2, a data writing sub-circuit 4, a driving sub-circuit 3, a first light emission control sub-circuit 5, a second light emission control sub-circuit 6, and a storage sub-circuit 7.

Referring to FIG. 2, the first light emission control sub-circuit 5 is coupled to a first voltage terminal VDD and a first terminal of the driving sub-circuit 3, respectively, and is configured to connect/disconnect the driving sub-circuit to/from the first voltage terminal VDD. The second light emission control sub-circuit 6 is electrically coupled to a second terminal of the driving sub-circuit and a first electrode D1 of the light emitting device D, respectively, and is configured to connect/disconnect the driving sub-circuit 3 to/from the light emitting device D. The data writing sub-circuit 4 is electrically coupled to the first terminal of the driving sub-circuit 3 and is configured to write a data signal into the storage sub-circuit 7 under the control of a scan signal. The storage sub-circuit 7 is electrically coupled to a control terminal of the driving sub-circuit 3 and the first voltage terminal VDD, respectively, and is configured to store the data signal. The threshold compensation sub-circuit 2 is electrically coupled to the control terminal and the second terminal of the driving sub-circuit 3, respectively, and is configured to perform threshold compensation on the driving sub-circuit 3. The reset sub-circuit 1 is electrically coupled to the control terminal of the driving sub-circuit 3 and the first electrode D1 of the light emitting device D, and is configured to reset the control terminal of the driving sub-circuit 3 and the first electrode D1 of the light emitting device D under the control of a reset control signal.

Figure 3:
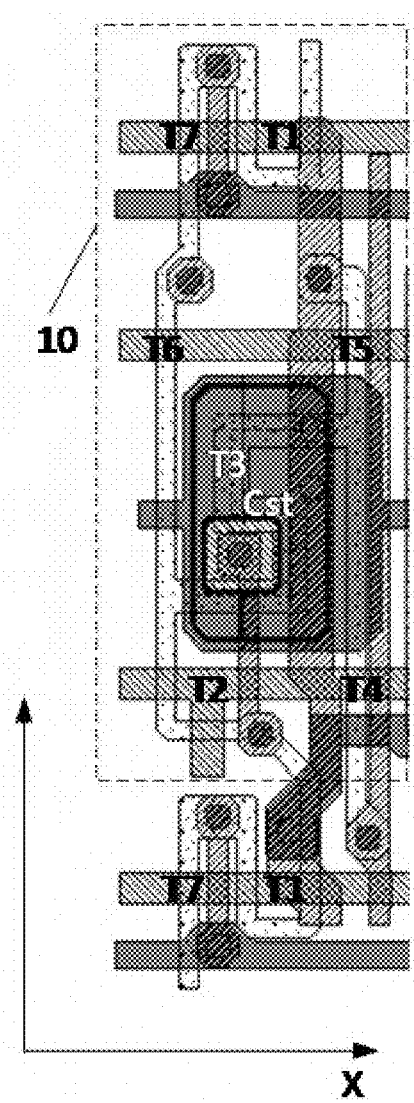
FIG. 3 is a layout of a pixel driving circuit according to an embodiment of the present disclosure.

FIG. 3 is a layout of the pixel driving circuit 10 according to an embodiment of the present disclosure. Referring to FIGS. 2 and 3, the driving sub-circuit 3 includes a driving transistor T3, the control terminal of the driving sub-circuit 3 includes a control electrode of the driving transistor T3, the first terminal of the driving sub-circuit 3 includes a first electrode of the driving transistor T3, and the second terminal of the driving sub-circuit 3 includes a second electrode of the driving transistor T3. The data writing sub-circuit 4 includes a data writing transistor T4, the storage sub-circuit 7 includes a storage capacitor Cst, the threshold compensation sub-circuit 2 includes a threshold compensation transistor T2, the first light emission control sub-circuit 5 includes a first light emission control transistor T5, the second light emission control sub-circuit 6 includes a second light emission control transistor T6, and the reset sub-circuit 1 includes a first reset transistor T1 and a second reset transistor T7, and the reset control signal includes a first sub-reset control signal and a second sub-reset control signal.

It should be noted that, according to the characteristics of the transistors, the transistors may be classified into N-type transistors and P-type transistors. For the sake of clarity, the embodiments of the present disclosure use the transistors as P-type transistors (for example, P-type MOS transistors) to illustrate the technical solutions of the present disclosure in detail. That is, in the description of the present disclosure, the driving transistor T3, the data writing transistor T4, the threshold compensation transistor T2, the first light emission control transistor T5, the second light emission control transistor T6, the first reset transistor T1, the second reset transistor T7, and the like may all be P-type transistors. However, the transistors of the embodiments of the present disclosure are not limited to P-type transistors, and one skilled in the art may also implement the functions of one or more transistors of the embodiments of the present disclosure by using N-type transistors (e.g., N-type MOS transistors) or a combination of P-type transistors and N-type transistors according to actual needs.

In addition, the transistors used in the embodiments of the present disclosure may be thin film transistors, field effect transistors or other switching devices having the same characteristics, and the thin film transistors may include oxide semiconductor thin film transistors, amorphous silicon thin film transistors, polysilicon thin film transistors, and the like. Each transistor includes a first electrode, a second electrode and a control electrode. The control electrode serves as a gate electrode of the transistor, one of the first electrode and the second electrode serves as a source electrode of the transistor, and the other serves as a drain electrode of the transistor. The source and drain electrodes of the transistor may be symmetrical in structure, so that there may be no difference between the source electrode and the drain electrode in physical structure. In an embodiments of the present disclosure, in order to distinguish transistors, except for the gate electrode serving as the control electrode, the first electrode is directly described as the source electrode, and the second electrode is directly described as the drain electrode, so that the source and the drain electrodes of all or some of the transistors in the embodiments of the present disclosure may be interchanged as necessary.

Continuing to refer to FIG. 2, the source electrode of the data writing transistor T4 is electrically coupled to the source electrode of the driving transistor T3, the drain electrode of the data writing transistor T4 is configured to be electrically coupled to the data line Vd to receive the data signal, and the gate electrode of the data writing transistor T4 is configured to be electrically coupled to a first scan signal line Ga1 to receive the scan signal. A first plate CC1 of the storage capacitor Cst is electrically coupled to the first power voltage terminal VDD, and a second plate CC2 of the storage capacitor Cst is electrically coupled to the gate electrode of the driving transistor T3. A source electrode of the threshold compensation transistor T2 is electrically coupled to the drain electrode of the driving transistor T3, a drain electrode of the threshold compensation transistor T2 is electrically coupled to the gate electrode of the driving transistor T3, and a gate electrode of the threshold compensation transistor T2 is configured to be electrically coupled to a second scan signal line Ga2 to receive a compensation control signal. A source electrode of the first reset transistor T1 is configured to be electrically coupled to the first reset power terminal Vinit1 to receive a first reset signal, a drain electrode of the first reset transistor T1 is electrically coupled to the gate electrode of the driving transistor T3, and a gate electrode of the first reset transistor T1 is configured to be electrically coupled to a first reset control signal line Rst1 to receive a first sub-reset control signal. A source electrode of the second reset transistor T7 is configured to be electrically coupled to the first reset power terminal Vinit1 to receive the first reset signal, a drain electrode of the second reset transistor T7 is electrically coupled to the first electrode D1 of the light emitting device D, and a gate electrode of the second reset transistor T7 is configured to be electrically coupled to the second reset control signal line Rst2 to receive a second sub-reset control signal. A source electrode of the first light emission control transistor T5 is electrically coupled to the first power voltage terminal VDD, a drain electrode of the first light emission control transistor T5 is electrically coupled to the source electrode of the driving transistor T3, and a gate electrode of the first light emission control transistor T5 is configured to be electrically coupled to a first light emission control signal line EM1 to receive a first light emission control signal. A source electrode of the second light emission control transistor T6 is electrically coupled to the drain electrode of the driving transistor T3, a drain electrode of the second light emission control transistor T6 is electrically coupled to the first electrode D1 of the light emitting device D, and a gate electrode of the second light emission control transistor T6 is configured to be electrically coupled to a second light emission control signal line EM2 to receive a second light emission control signal. A second electrode D3 of the light emitting device D is electrically coupled to a second power voltage terminal VSS.

For example, one of the first power voltage terminal VDD and the second power voltage terminal VSS is a terminal providing a high voltage, and the other is a terminal providing a low voltage. For example, in an embodiment as shown in FIG. 2, the first power voltage terminal VDD is a voltage source to output a constant first voltage, which is a positive voltage; and the second power voltage terminal VSS may be a voltage source to output a constant second voltage, which is a negative voltage. For example, in some examples, the second power voltage terminal VSS may be grounded.

With continued reference to FIG. 2, the scan signal and the compensation control signal may be the same, i.e., the gate electrode of the data writing transistor T4 and the gate electrode of the threshold compensation transistor T2 may be electrically coupled to the same signal line, e.g., the first scan signal line Ga1, to receive the same signal (e.g., the scan signal). In this case, the display substrate may not be provided with the second scan signal line Ga2, thereby reducing the number of signal lines. For another example, the gate electrode of the data writing transistor T4 and the gate electrode of the threshold compensation transistor T2 may be electrically coupled to different signal lines, i.e., the gate electrode of the data writing transistor T4 is electrically coupled to the first scan signal line Ga1, the gate electrode of the threshold compensation transistor T2 is electrically coupled to the second scan signal line Ga2, and the signals transmitted by the first scan signal line Ga1 and the second scan signal line Ga2 are the same.

It should be noted that the scan signal and the compensation control signal may not be the same, so that the gate electrode of the data writing transistor T4 and the gate electrode of the threshold compensation transistor T2 may be separately controlled, thereby increasing the flexibility of controlling the pixel driving circuit 10. In an embodiment of the present disclosure, the explanation is given by taking a case where the gate electrode of the data writing transistor T4 and the gate electrode of the threshold compensation transistor T2 are electrically coupled to the first scan signal line Ga1 as an example.

Continuing to refer to FIG. 2, the first and second light emission control signals may be the same, i.e., the gate electrode of the first light emission control transistor T5 and the gate electrode of the second light emission control transistor T6 may be electrically coupled to the same signal line (e.g., the first light emission control signal line EM1) to receive the same signal (e.g., the first light emission control signal). In this case, the display substrate may not be provided with the second light emission control signal line EM2, thereby reducing the number of signal lines. For another example, the gate electrode of the first light emission control transistor T5 and the gate electrode of the second light emission control transistor T6 may be electrically coupled to different signal lines, respectively, that is, the gate electrode of the first light emission control transistor T5 is electrically coupled to the first light emission control signal line EM1, the gate electrode of the second light emission control transistor T6 is electrically coupled to the second light emission control signal line EM2, and the signals transmitted by the first light emission control signal line EM1 and the second light emission control signal line EM2 are the same.

It should be noted that, in a case where the first light emission control transistor T5 and the second light emission control transistor T6 are different types of transistors (for example, the first light emission control transistor T5 is a P-type transistor, and the second light emission control transistor T6 is an N-type transistor), the first light emission control signal and the second light emission control signal may also be different, and the embodiments of the disclosure are not limited thereto. In an embodiment of the present disclosure, the explanation is given by taking a case where the first light emission control line is coupled to the gate electrodes of the first light emission control transistor T5 and the second light emission control transistor T6 as an example.

For example, the first and second sub-reset control signals may be the same, that is, the gate electrode of the first reset transistor T1 and the gate electrode of the second reset transistor T7 may be electrically coupled to the same signal line (for example, the first reset control signal line Rst1) to receive the same signal (for example, the first sub-reset control signal). In this case, the display substrate may not be provided with the second reset control signal line Rst2, thereby reducing the number of signal lines. For another example, the gate electrode of the first reset transistor T1 and the gate electrode of the second reset transistor T7 may be electrically coupled to different signal lines, respectively, that is, the gate electrode of the first reset transistor T1 is electrically coupled to the first reset control signal line Rst1, the gate electrode of the second reset transistor T7 is electrically coupled to the second reset control signal line Rst2, and the signals transmitted by the first reset control signal line Rst1 and the second reset control signal line Rst2 are the same. It should be noted that the first sub-reset control signal and the second sub-reset control signal may be also different.

For example, in some examples, the second sub-reset control signal may be the same as the scan signal, i.e., the gate electrode of the second reset transistor T7 may be electrically coupled to the scan signal line Ga to receive the scan signal as the second sub-reset control signal.

For example, the source electrode of the first reset transistor T1 and the source electrode of the second reset transistor T7 are coupled to the first reset power terminal Vinit1 and the second reset power terminal Vinit2, respectively, and the first reset power terminal Vinit1 and the second reset power terminal Vinit2 may be DC reference voltage terminals to output constant DC reference voltages. The first reset power terminal Vinit1 and the second reset power terminal Vinit2 may be the same, for example, the source electrode of the first reset transistor T1 and the source electrode of the second reset transistor T7 are coupled to the same reset power terminal. The first and second reset power terminals Vinit1 and Vinit2 may be terminals providing high voltages or terminals providing low voltages, as long as they can provide first reset signals to reset the gate electrode of the driving transistor T3 and the first electrode D1 of the light emitting device, and the present disclosure is not limited thereto. For example, the source electrode of the first reset transistor T1 and the source electrode of the second reset transistor T7 may both be coupled to the reset power signal line Init.

Continuing to refer to FIG. 3, for each pixel driving circuit 10, in a first direction, the first transistor and the seventh transistor are arranged substantially side by side, the second transistor, the third transistor, the fourth transistor are arranged substantially side by side, and the fifth transistor and the sixth transistor are arranged substantially side by side. In a second direction, the second transistor, the sixth transistor, and the seventh transistor are arranged substantially side by side, the first transistor and the third transistor are arranged substantially side by side, and the fourth transistor and the fifth transistor are arranged substantially side by side. In an embodiment, the first direction may include but is not limited to a row direction X, the second direction includes but is not limited to a column direction Y, and the first and second directions include but are not limited to directions that are perpendicular or substantially perpendicular. In an embodiment of the present disclosure, the explanation is given by taking a case where the first direction is the row direction X, and the second direction is the column direction Y as an example.

It should be noted that the reset sub-circuit 1, the threshold compensation sub-circuit 2, the data writing sub-circuit 4, the driving sub-circuit 3, the first light emission control sub-circuit 5, the second light emission control sub-circuit 6, and the storage sub-circuit 7 in the pixel driving circuit 10 shown in FIG. 2 are only illustrative, and the specific structures of the sub-circuits such as the reset sub-circuit 1, the threshold compensation sub-circuit 2, the data writing sub-circuit 4, the driving sub-circuit 3, the first light emission control sub-circuit 5, the second light emission control sub-circuit 6, and the storage sub-circuit 7 may be set according to practical application requirements, which is not limited in the embodiment of the present disclosure.

Each of the pixel driving circuits 10 may include an active semiconductor layer, a first gate insulating layer, a first conductive layer, a second gate insulating layer, a second conductive layer, an interlayer insulating layer, a third conductive layer, and a first planarization layer and/or a passivation layer sequentially disposed on a substrate. The light emitting device includes a first electrode, a second electrode, and a light emitting layer between the first electrode and the second electrode, one of the first electrode and the second electrode is an anode, and the other is a cathode. In embodiments of the present disclosure, the explanation is given by taking a case where the first electrode is an anode, and the second electrode is a cathode as an example. The anode of the light emitting device may be located at a side of the first planarization layer and/or the passivation layer away from the substrate. The active layers of the transistors are located in the active semiconductor layer, and the active semiconductor layer may include a pattern of a doped region that may serve as a source/drain electrode of each transistor. In an embodiment, the gate electrode of each transistor, one electrode of the storage capacitor (e.g., the second plate of the storage capacitor Cst), the gate line, the first and second light emission control signal lines EM1 and EM2, and the first and second sub-reset control signal lines Rst1 and Rst may be located in the first conductive layer. In an embodiment, the other electrode of the storage capacitor (e.g., the first plate of the storage capacitor Cst) and the first reset power line Init1 and the second reset power line Init2 may be located in the second conductive layer. In an embodiment, the data line Vd, the first power voltage terminal VDD, and the like may be located in the third conductive layer. The first gate insulating layer, the second gate insulating layer, and the interlayer insulating layer have via holes formed therein for connection of the pattern in the above respective conductive layers and the pattern in the active semiconductor layer. In an embodiment, the first planarization layer and/or the passivation layer has a via hole formed therein for connection with the anode of the light emitting device. In some other embodiments, the display substrate may further include a fourth conductive layer, and a second planarization layer located on a side of the fourth conductive layer away from the substrate, and the anode is formed on a side of the second planarization layer away from the substrate. The fourth conductive layer is coupled to the third conductive layer through a via hole formed in the first planarization layer/passivation layer, and the second planarization layer is formed with a via hole therein for connecting the anode to the fourth conductive layer.

It should be noted that, in an embodiment of the present disclosure, the pixel driving circuit 10 of the sub-pixel may also be a structure including other number of transistors other than the 7T1C (i.e., seven-transistors-and-one-capacitor) structure shown in FIGS. 2 and 3, for example, a 7T2C structure, a 6T1C structure, a 6T2C structure, or a 9T2C structure, which is not limited in the embodiment of the present disclosure.

Figure 4:
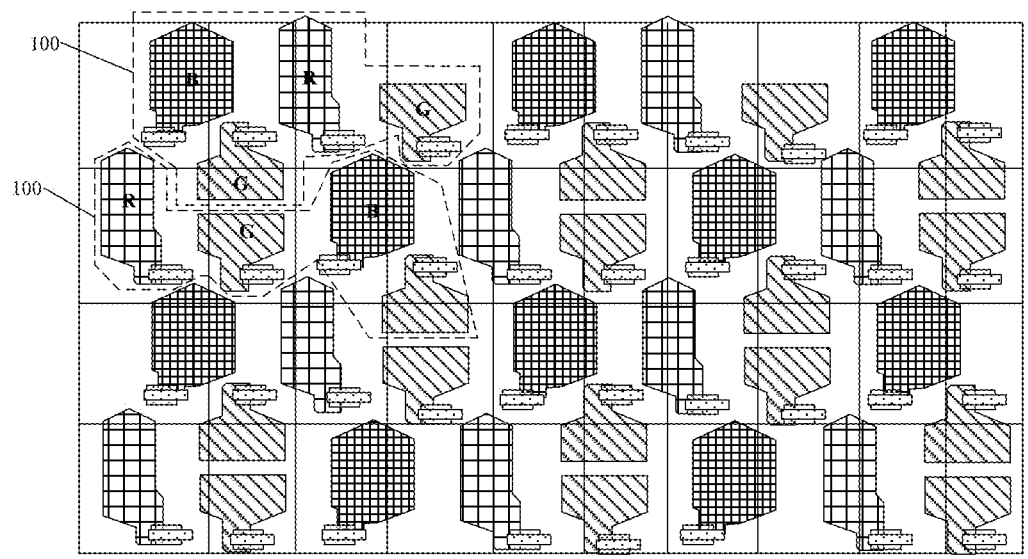
FIG. 4 is a schematic distribution diagram of light emitting devices in a display substrate according to an embodiment of the present disclosure.

FIG. 4 is a schematic distribution diagram of light emitting devices in a display substrate according to an embodiment of the present disclosure. As shown in FIG. 4, the display substrate includes a plurality of light emitting units 100, and each light emitting unit includes light emitting devices D of three colors, i.e., a first color light emitting device, a second color light emitting device, and a third color light emitting device. In an embodiment of the present disclosure, the description will be given by taking a case where the first color light emitting device is a red light emitting device R, the second color light emitting device is a green light emitting device G, and the third color light emitting device is a blue light emitting device B as an example. But the present disclosure is not limited thereto, and the colors may be interchanged.

Continuing to refer to FIG. 4, taking the case where the first color light emitting device is the red light emitting device R, the second color light emitting device is the green light emitting device G, and the third color light emitting device is the blue light emitting device B as an example, in each light emitting unit 100, the number of the red light emitting device R is 2, and the number of the green light emitting device G and the number of the blue light emitting device B are 1, respectively. Alternatively, in each light emitting unit 100, the number of green light emitting device G is 2, and the number of red light emitting device R and the number of blue light emitting device G are 1, respectively. Alternatively, in each light emitting unit 100, the number of the blue light emitting device B is 2, and the number of the red and green light emitting device R and G is 1. Of course, it should be further noted that, in the embodiment of the present disclosure, the colors of the light emitting devices D in each light emitting unit 100 are not limited to three. For example, each pixel unit includes four color light emitting devices D of a red light emitting device R, a green light emitting device G, a blue light emitting device B, and a white light emitting device W. In an embodiment of the present disclosure, the explanation is given by taking a case where each light emitting unit 100 includes two green light emitting devices G, one red light emitting device R and one blue light emitting device B as an example.

Figure 5:
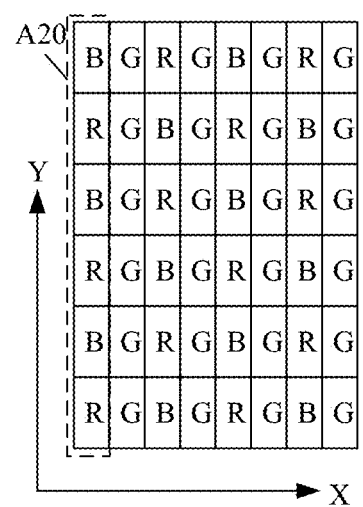
FIG. 5 is another schematic distribution diagram of light emitting devices in the display substrate according to an embodiment of the present disclosure.

FIG. 5 is another schematic distribution diagram of light emitting devices in the display substrate according to an embodiment of the disclosure. As shown in FIG. the light emitting devices D in the display substrate are illustrated as a plurality of light emitting device groups A20 arranged in the row direction X, and each light emitting device group A20 includes a plurality of light emitting devices D arranged in the column direction Y. As shown in FIG. 5, the light emitting devices D in the odd-numbered columns are red light emitting devices R and blue light emitting devices B alternately arranged, and the light emitting devices D in the even-numbered columns are green light emitting devices G. Of course, the light emitting devices D in the odd-numbered columns may be interchanged with the light emitting devices D in the even-numbered columns.

In addition, the four light emitting devices D of each light emitting unit 100 in the first and second display regions Q1 and Q2 are respectively driven by the four pixel driving circuits adjacently disposed in the same row. The pixel driving circuits 10, of the light emitting devices D located in the same region and in the same column, are also located in the same column. For example, the pixel driving circuits 10, of the light emitting devices D located in the mounting region Q3 and in the same column, are also in the same column in the first display region Q1.

An embodiment of the present disclosure provides a display substrate having substantially the same structure as the display substrate described above, and having a mounting region Q3, a first display region Q1, and a second display region Q2. The display substrate in the embodiment of the present disclosure includes a substrate, a plurality of pixel driving circuits 10 and a plurality of light emitting devices D disposed on the substrate. In an embodiment, the plurality of pixel driving circuits 10 are disposed only in the first display region Q1 and the second display region Q2, the plurality of light emitting devices D include a plurality of light emitting device groups A20 arranged in the row direction X, and the light emitting devices D in each of the light emitting device groups A20 are arranged in the column direction Y. In an embodiment of the present disclosure, the resolutions of the display substrate in the first display region Q1, the second display region Q2, and the mounting region Q3 are the same, that is, the numbers of the light emitting devices D in the first display region Q1, the second display region Q2, and the mounting region Q3 per unit area are the same. In some embodiments, ratios of respective light emission areas of at least two of the first display region Q1, the second display region Q2, and the mounting region Q3 to respective total areas of the at least two of the first display region Q1, the second display region Q2, and the mounting region Q3 are different from each other. For example, the pixel driving circuits 10 of the light emitting devices D in the mounting region Q3 are disposed in the first display region Q1, that is, in the embodiment of the present disclosure, the arrangement density of the pixel driving circuits 10 in the first display region Q1 is greater than the arrangement density of the pixel driving circuits 10 in the second display region Q2.

It should be noted that the arrangement density of the pixel driving circuits 10 is measured by the number of pixel driving circuits 10 provided in a unit area.

In some embodiments of the present disclosure, a ratio of the area of the pattern of the active semiconductor layer in the first display region Q1 to the area of the first display region Q1 is greater than a ratio of the area of the pattern of the active semiconductor layer in the second display region Q2 to the area of the second display region Q2.

In some embodiments of the present disclosure, a ratio of the area of the pattern of at least one of the first conductive layer, the second conductive layer, the third conductive layer, and the fourth conductive layer in the first display region Q1 to the area of the first display region Q1 is greater than a ratio of the area of the pattern of the respective one(s) of the first conductive layer, the second conductive layer, the third conductive layer, and the fourth conductive layer in the second display region Q2 to the area of the second display region Q2. That is, the ratio of the area of the pattern of the first conductive layer in the first display region Q1 to the area of the first display region Q1 is greater than the ratio of the area of the corresponding pattern of the first conductive layer in the second display region Q2 to the area of the second display region Q2, and/or, the ratio of the area of the pattern of the second conductive layer in the first display region Q1 to the area of the first display region Q1 is greater than the ratio of the area of the corresponding pattern of the second conductive layer in the second display region Q2 to the area of the second display region Q2, and/or, the ratio of the area of the pattern of the third conductive layer in the first display region Q1 to the area of the first display region Q1 is greater than the ratio of the area of the corresponding pattern of the third conductive layer in the second display region Q2 to the area of the second display region Q2, and/or, the ratio of the area of the pattern of the fourth conductive layer in the first display region Q1 to the area of the first display region Q1 is greater than the ratio of the area of the corresponding pattern of the fourth conductive layer in the second display region Q2 to the area of the second display region Q2.

Figure 6:
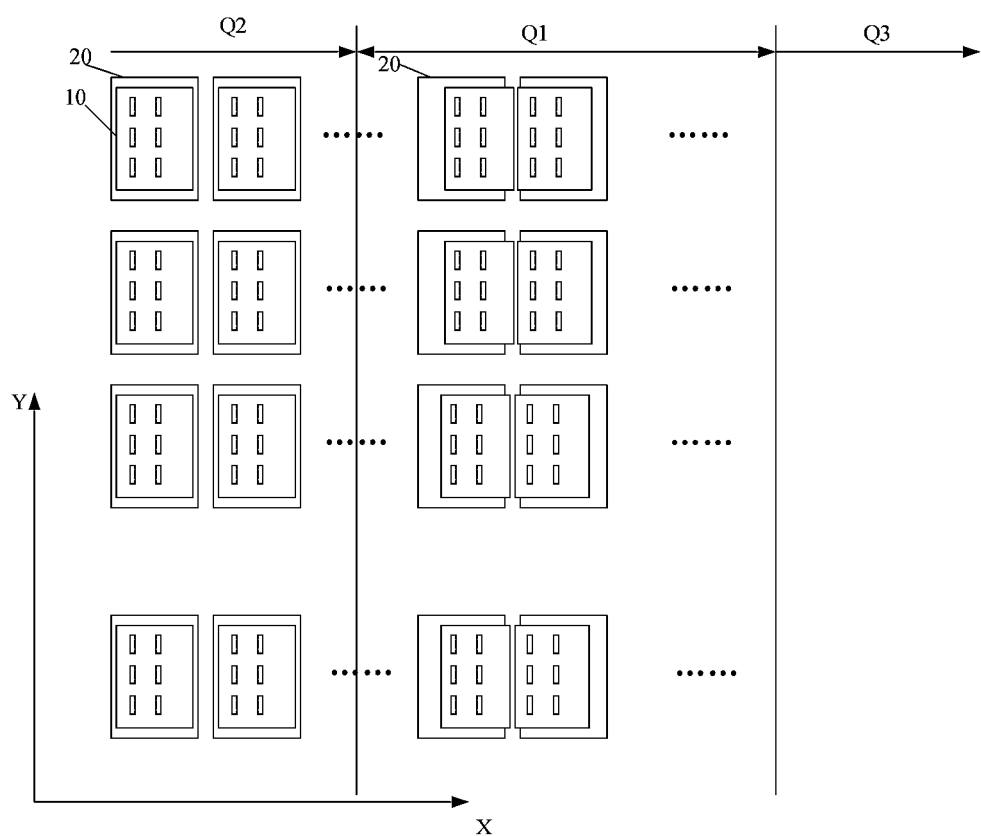
FIG. 6 is a schematic diagram illustrating an arrangement of pixel driving circuits in a first display region and a second display region according to an embodiment of the present disclosure.

In an embodiment of the present disclosure, the manner of achieving the arrangement density of the pixel driving circuits 10 in the first display region Q1 greater than the arrangement density of the pixel driving circuits 10 in the second display region Q2 includes, but is not limited to, reducing the distances, in the row direction X and/or the column direction Y, between at least some transistors in at least some pixel driving circuits 10 in the first display region Q1 to reduce the width of the pixel driving circuit 10. For example, FIG. 6 is a schematic diagram of a compressed pixel driving circuit 10 according to an embodiment of the disclosure. Referring to FIG. 6, the distance between the transistors arranged side by side in the row direction X may be compressed. Specifically, at least one of the distance between the first transistor and the seventh transistor, the distance between the second transistor, the third transistor, the fourth transistor, and the distance between the fifth transistor and the sixth transistor may be compressed. For example, the distance between the transistors arranged side by side in the column direction Y may be compressed. Specifically, at least one of the distance between the seventh transistor T7, the second transistor T2, and the sixth transistor T6, the distance between the first transistor T1 and the third transistor T3, and the distance between the fourth transistor T4 and the fifth transistor T5 may be compressed. For example, the distance between transistors disposed in the row direction X and the distance between transistors disposed in the column direction Y may also be compressed at the same time. In an embodiment of the present disclosure, it is also possible to achieve a greater arrangement density of the pixel driving circuits 10 in the first display region Q1 than the arrangement density of the pixel driving circuits 10 in the second display region Q2 by compressing the width of the data line Vd in the row direction X configured to supply the data signal to the pixel driving circuits 10 of the light emitting devices D in the mounting region Q3. In an embodiment of the present disclosure, it is also possible to achieve a greater arrangement density of the pixel driving circuits 10 in the first display region Q1 than the arrangement density of the pixel driving circuits 10 in the second display region Q2 by compressing the width of other signal lines or patterns in the conductive layer. FIG. 6 is a schematic layout of pixel driving circuits in the first display region and the second display region according to an embodiment of the present disclosure. As shown in FIG. 6, the area of the pixel driving circuit 10 in the second display region Q2 is significantly larger than the area of the pixel driving circuit 10 in the first display region Q1 per unit area 20.

In some embodiments, the display substrate further includes a plurality of data lines Vd, and at least some data lines Vd include portions located at different layers. For example, one data line Vd may include a portion disposed in the same layer as the gate electrode of the transistor, a portion disposed in the same layer as the source and drain electrodes of the transistor, a portion disposed in the same layer as the first electrode D1 of the light emitting device D, and the like. In an embodiment of the present disclosure, the data line Vd including the portions in different layers includes, but is not limited to, the data line Vd supplying the data signal to the pixel driving circuit 10 of the light emitting device D in the mounting region Q3.

In some embodiments, a portion of the data lines Vd in the display substrate is arranged in a bend line in the display region. For example, one data line Vd includes a portion extending in the row direction X, a portion extending in the column direction Y, and a portion extending in a direction having an angle with the row direction X and/or the column direction Y. In some embodiments, the data line Vd includes a portion located in the first display region Q1 and a portion located in the second display region Q2, and the two portions are not on the same straight line, so that the data line Vd is arranged as a bend line. For example, the portion of the data line Vd in the first display region Q1 is a straight line, and the portion of the data line Vd in the second display region Q2 is a bend line. In some embodiments, the portion located in the first display region Q1 and the portion located in the second display region Q2 are both straight lines and are not parallel to each other, so that the data line Vd is arranged as a bend line. For example, the portion of the data line Vd located in the first display region Q1 extends in the column direction Y, and the extending direction of the portion of the data line Vd located in the second display region Q2 has an angle with the row direction X; or the extending direction of the portion of the data line Vd located in the first display region Q1 has an angle with the row direction X, and the portion of the data line Vd located in the second display region Q2 extends in the column direction Y.

Figure 7:
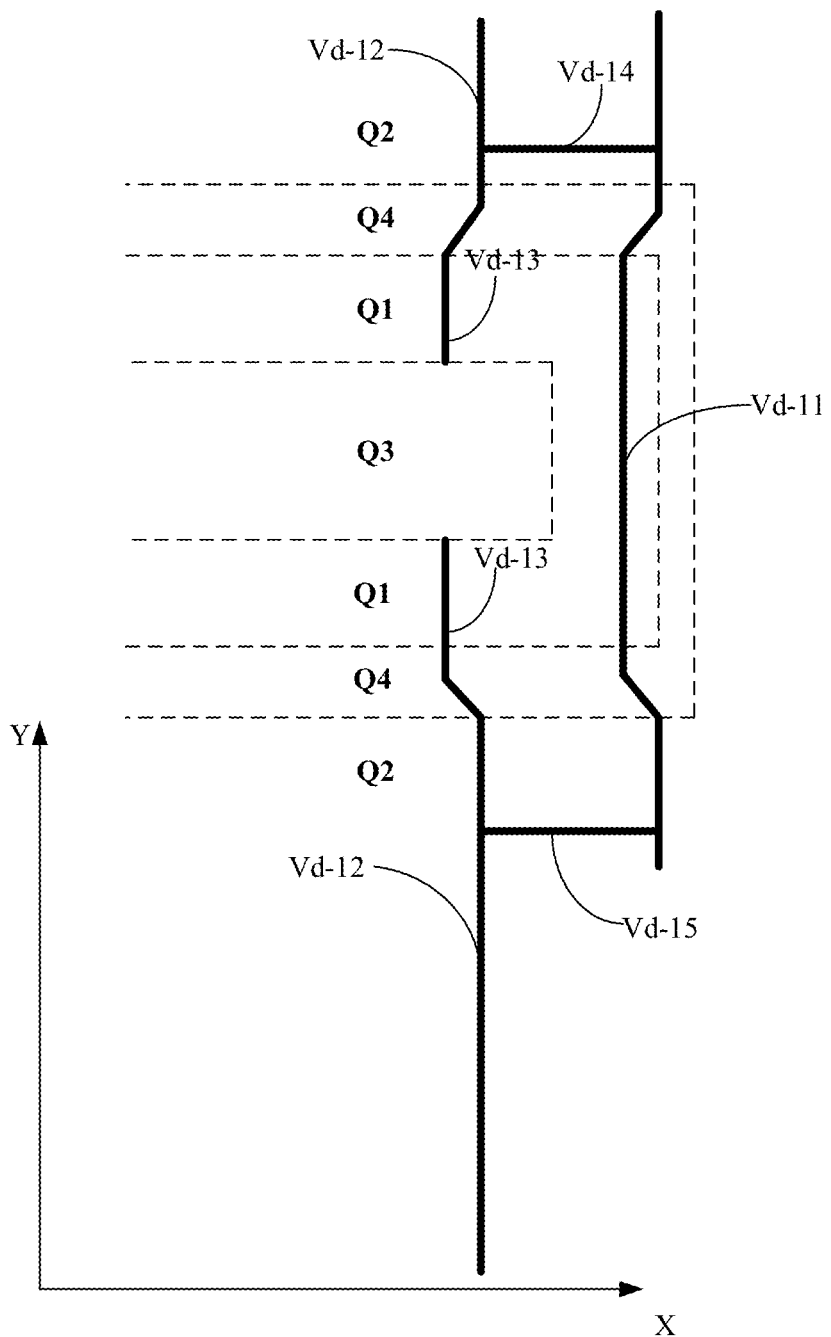
FIGS. 7-10 are schematic diagrams of a first data line according to embodiments of the present disclosure.

In some embodiments, FIG. 7 is a schematic diagram of a first data line according to an embodiment of the present disclosure. As shown in FIG. 7, at least one data line Vd among the data lines Vd arranged as a bend line is a first data line Vd-1, the first data line Vd-1 includes a first sub data line segment Vd-11 coupled to the pixel driving circuit 10 for driving the light emitting device D in the mounting region Q3, and a second sub data line segment Vd-12 coupled to the pixel driving circuit 10 for driving the light emitting device D in the second display region Q2, and the first sub data line segment Vd-11 and the second sub data line segment Vd-12 are not on the same straight line. The one data line Vd refers to a data line Vd coupled to the same end of the data driving IC and transmitting the same signal, and may include portions located on different conductive layers.

In some embodiments, the first and second sub data line segments Vd-11, Vd-12 include portions that are substantially parallel. For example, the first sub data line segment Vd-11 and the second sub data line segment Vd-12 both extend in the column direction Y.

In some embodiments, continuing to refer to FIG. 7, the first data line Vd-1 may further include a third sub data line segment Vd-13 for driving the light emitting devices D in the first display region Q1, the first sub data line segment Vd-11 and the third sub data line segment Vd-13 not being on the same straight line. For example, the first sub data line segment Vd-11 extends along the column direction Y, and the third sub data line segment Vd-13 has a certain angle with the column direction Y or the third sub data line segment Vd-13 is a bend line.

Figure 8:
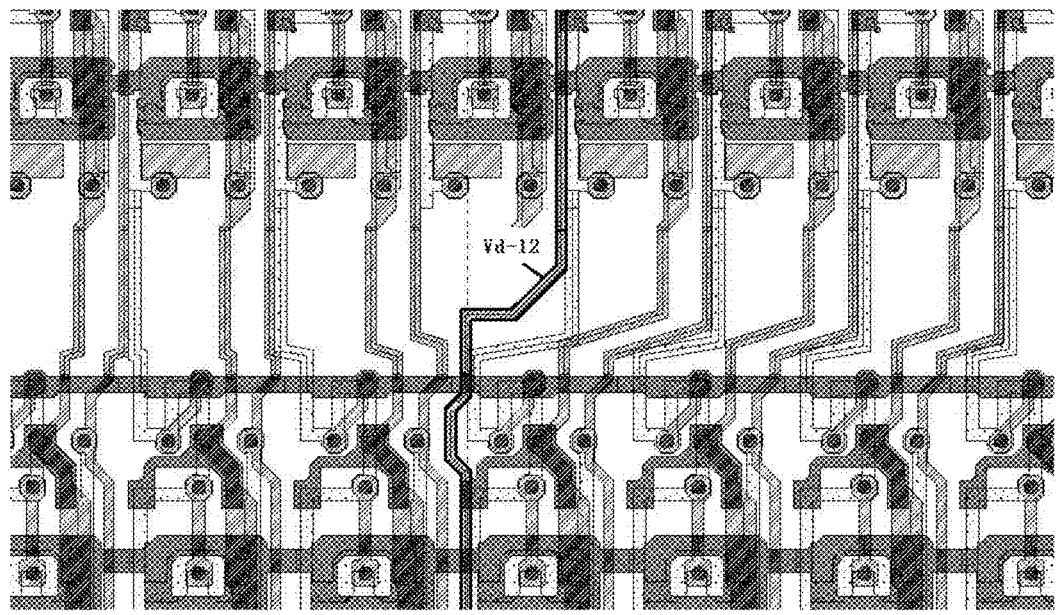
Figure 9:
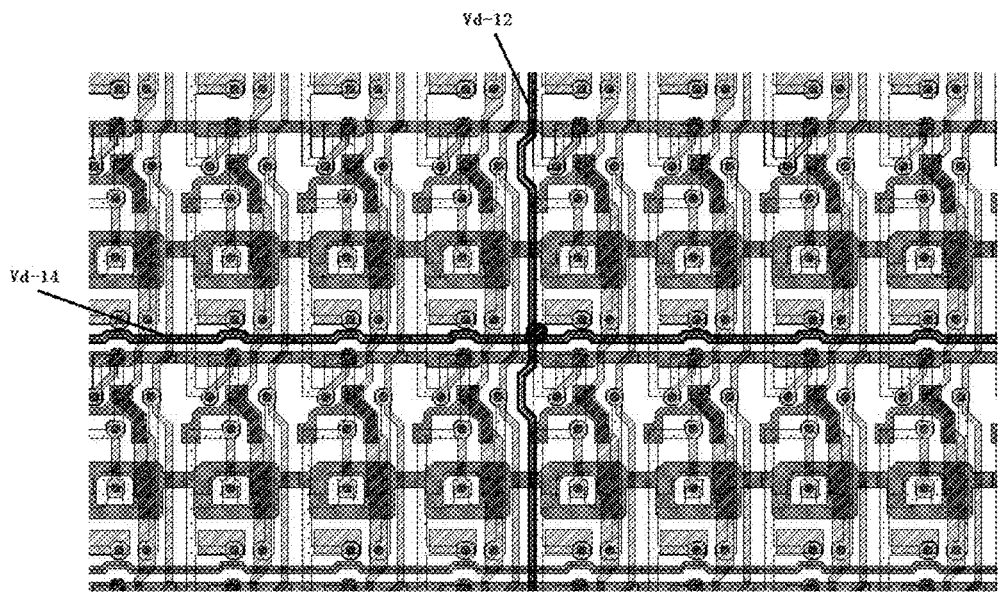

In some embodiments, the first sub data line segment includes a different material from the second sub data line segment, and/or the first sub data line segment includes a different material from the third sub data line segment. In some embodiments, continuing to refer to FIGS. 7-9, the first data line Vd-1 includes not only the first sub data line segment Vd-11, the second sub data line segment Vd-12, and the third sub data line segment Vd-13, but also a first transfer electrode Vd-14 and a second transfer electrode Vd-15. For example, the second sub data line segment Vd-12 includes a first part and a second part which are respectively arranged on two opposite sides of the mounting region in the column direction Y; one end of the first sub data line segment Vd-11 is electrically coupled to the first part of the second sub data line segment Vd-12 through the first transfer electrode Vd-14, and the other end of the first sub data line segment Vd-11 is electrically coupled to the second part of the second sub data line segment Vd-12 through the second transfer electrode Vd-15.

In one example, at least some first transfer electrodes Vd-14 and at least some second transfer electrodes Vd-15 have substantially the same length in the row direction X, e.g., each of the first and second transfer electrodes Vd-14 and Vd-15 has the same length in the row direction X. In this case, it is ensured that the coupling line capacitances are the same between the first transfer electrodes Vd-14 and between the second transfer electrodes Vd-15. In some embodiments, the first and second transfer electrodes Vd-14 and Vd-15 include, but are not limited to, being disposed in the same layer and the same material as the first plate of the storage capacitor. For example, the first and second transfer electrodes Vd-14 and Vd-15 are disposed in the second conductive layer. The first sub data line segment Vd-11, the second sub data line segment Vd-12 and the third sub data line segment Vd-13 of the first data line Vd-1 include metal, such as Ti, Al and the like. The first sub data line segment Vd-11, the second sub data line segment Vd-12 and the third sub data line segment Vd-13 of the first data line Vd-1 are arranged in the third conductive layer.

Figure 10:
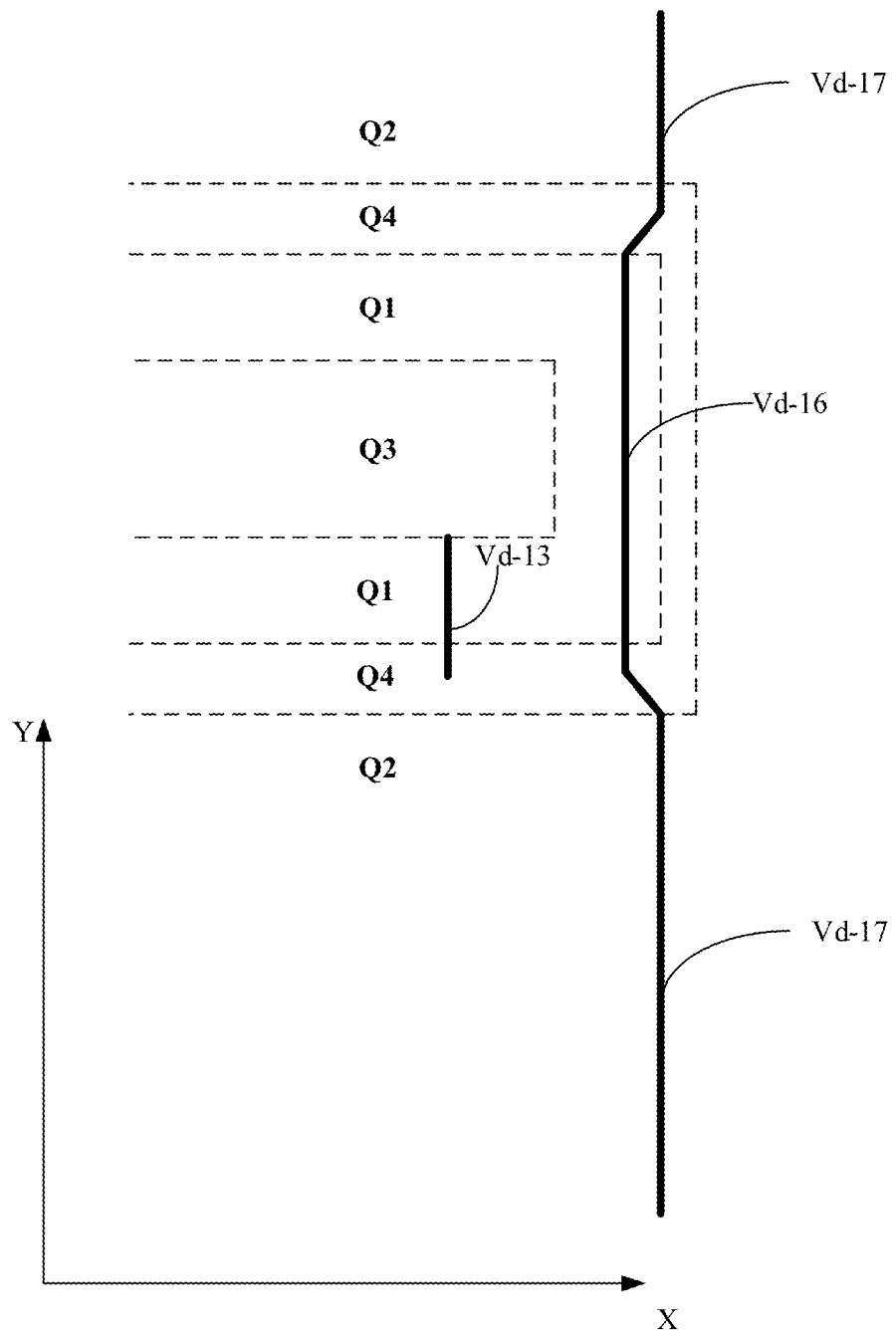

In some embodiments, FIG. 10 is a schematic diagram of a second data line according to an embodiment of the present disclosure. As shown in FIG. 10, some data lines Vd arranged in a bend line include a second data line Vd-2, and the second data line Vd-2 includes a fourth sub data line segment Vd-16 coupled to the pixel driving circuits 10 for driving the light emitting devices D in the second display region Q2 and a fifth sub data line segment Vd-17 coupled to the pixel driving circuits 10 for driving the light emitting devices D in the first display region Q1.

In some embodiments, the fourth and fifth sub data line segments Vd-16 and Vd-17 are not on the same straight line. For example, the fourth sub data line segment Vd-16 includes two portions located at opposite sides of the second display region Q2 in the column direction, the two portions extending in the column direction Y, and the fifth sub data line segment Vd-17 is a bend line.

In some embodiments, in the first display region Q1, the distance between nodes at which two pixel driving circuits 10 adjacent in the row direction X are respectively coupled to corresponding data lines Vd is d1; in the second display region Q2, the distance between nodes at which two pixel driving circuits 10 adjacent in the row direction X are respectively coupled to corresponding data lines Vd is d2; and d1 is less than d2. That is, the distance of two data lines Vd adjacently disposed in the row direction X in the first display region Q1 is smaller than the distance of the two data lines Vd adjacently disposed in the row direction X in the second display region Q2. The node at which the pixel driving circuit 10 is coupled to the data line Vd is, for example, a via hole for connecting the data line to the data writing transistor.

It should be noted that, in an embodiment of the present disclosure, the data lines Vd, the first data lines Vd-1, and the second data lines Vd-2 may be directly coupled to the pixel driving circuits 10, and the term "directly coupled" includes a manner of being coupled through via holes penetrating through the insulating layer. Of course, the data lines Vd, the first data lines Vd-1, and the second data lines Vd-2 may be coupled to the pixel driving circuits 10 by means of transfer electrodes and the like.

In some embodiments, the pixel driving circuits 10 of the light emitting devices D in the same column are electrically coupled to the same data line Vd, and the pixel driving circuits 10 in the same row are electrically coupled to the same gate line, so that the layout of the signal lines on the display substrate can be easy, and the control of the pixel driving circuits 10 can be facilitated.

Figure 11:
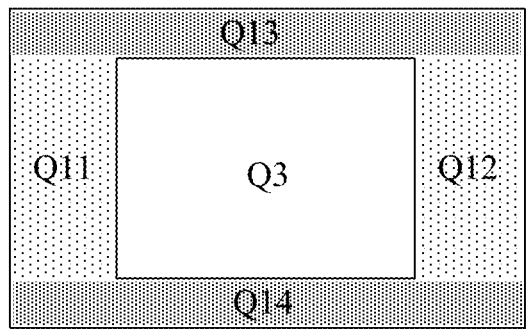
FIG. 11 is a schematic diagram of a second data line according to an embodiment of the present disclosure.

In some embodiments, FIG. 11 is a schematic diagram of a mounting region Q3 and a first display region Q1 of a display substrate according to an embodiment of the present disclosure. As shown in FIG. 11, the mounting region Q3 may include, but is not limited to, a rectangle shape, a circle shape, an oval shape, and a drop shape, and the mounting region Q3 is exemplified as a rectangle in an embodiment of the present disclosure. The portion of the first display region Q1 around the mounting region Q3 is divided into a first sub display region Q11 and a second sub display region Q12 oppositely disposed in the row direction X, and a third sub display region Q13 and a fourth sub display region Q14 oppositely disposed in the column direction Y. The plurality of pixel driving circuits 10 in the display substrate of the embodiment of the present disclosure may be divided into a plurality of first pixel driving circuit groups disposed along the row direction X and located in the first display region Q1, and a plurality of second pixel driving circuit groups located in the second display region Q2. The pixel driving circuits 10 in each of the first pixel driving circuit group and the second pixel driving circuit group are arranged in the column direction Y. For example, the number of the light emitting device groups A20 in the mounting region Q3 is M, and in this case, the pixel driving circuits 10 in the M first pixel driving circuit groups supply driving signals to the light emitting devices D in the mounting region Q3. For convenience of understanding, the first pixel driving circuit group supplying driving signals to the light emitting devices D in the mounting region Q3 is referred to as a first sub-pixel driving circuit group A10, in an embodiment of the present disclosure.

Figure 12:
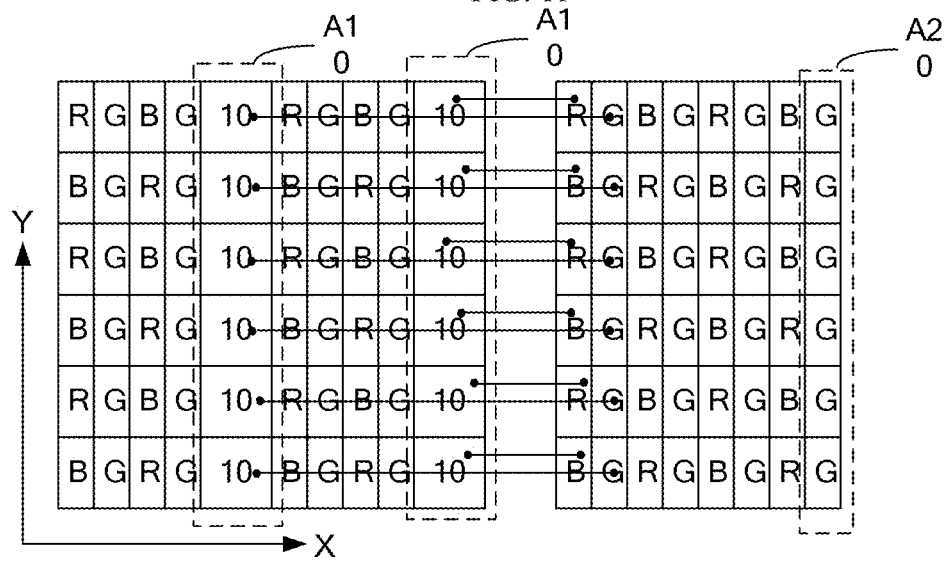
FIG. 12 is a schematic diagram of connection between light emitting devices in a mounting region and pixel driving circuits of a display substrate according to an embodiment of the present disclosure.

FIG. 12 is a schematic diagram of connection between the light emitting devices in the mounting region and the pixel driving circuits 10 of the display substrate according to an embodiment of the disclosure. As shown in FIG. 12, in one example, the pixel driving circuits 10 of the respective light emitting devices D belonging to the same light emitting device group A20 in the mounting region Q3 are located in the same first sub-pixel driving circuit group A10. This kind of connection is convenient for layout to avoid short circuit between signal lines.

Figure 13:
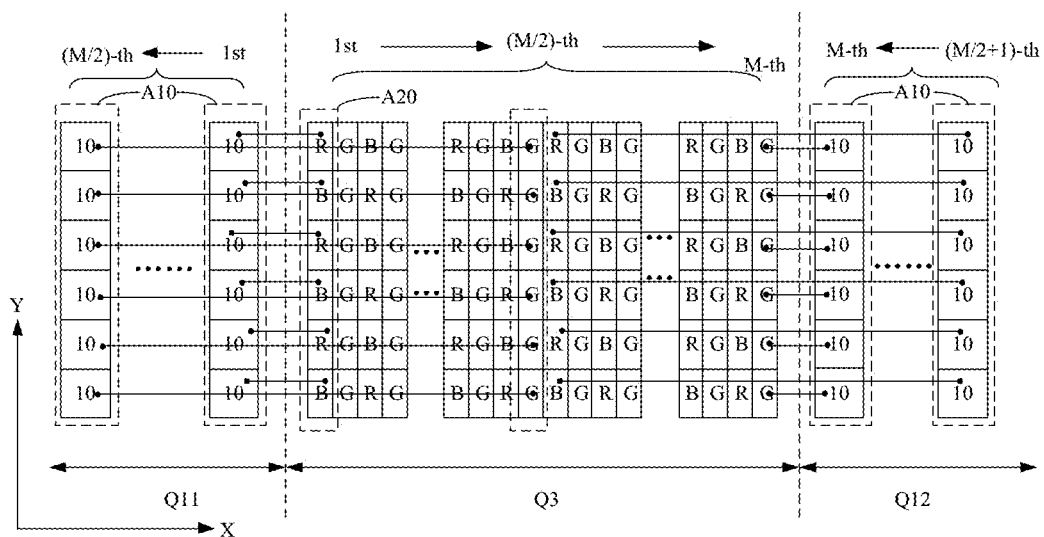
FIG. 13 is another schematic diagram of connection between light emitting devices in a mounting region and pixel driving circuits of a display substrate according to an embodiment of the present disclosure.

FIG. 13 is another schematic diagram of connection between light emitting devices in a mounting region and pixel driving circuits of a display substrate according to an embodiment of the present disclosure. As shown in FIG. 13, in some embodiments, at least some first sub-pixel driving circuit groups A10 have substantially the same distance from the edge of the mounting region Q3. For example, in some embodiments, M first sub-pixel driving circuit groups A10 are disposed in the first sub-display region Q11 and the second sub-display region Q12. Among the M light emitting device groups A20 in the mounting region Q3, the 1st to the M-th light emitting device groups A20 are arranged one by one in a direction from the first sub-display region Q11 towards the second sub-display region Q12. The first sub-display region Q11 and the second sub-display region Q12 are provided with M/2 first sub-pixel driving circuit groups A10, and the 1st to the (M/2)-th first sub-pixel driving circuit groups A10 are located in the first sub-display region Q11 and are sequentially arranged along a direction away from the mounting region Q3; the (M/2+1)-th to the M-th first sub-pixel driving circuit groups A10 are located in the second sub-display region Q12 and are sequentially arranged along a direction close to the mounting region Q3. The first electrodes D1 of the respective light emitting devices D in the i-th light emitting device group A20 in the mounting region Q3 are coupled to the pixel driving circuits 10 in the i-th first sub-pixel driving circuit group A10 in a one-to-one correspondence by signal connection lines, i having a value from 1 to M. For example, the pixel driving circuits 10 in the first sub-pixel driving circuit group A10, which is the first one (the one that is closest to the mounting region Q3) of the first sub-pixel driving circuit groups A10, in the first sub-display region Q11 are coupled in one-to-one correspondence to the first electrodes D1 of the light emitting devices D in the first light emitting device group A20 in the mounting region Q3.

For example, in some embodiments, M first sub-pixel driving circuit groups A10 are disposed in the first sub-display region Q11 and the second sub-display region Q12. Among the M light emitting device groups A20 in the mounting region Q3, the 1st to the M-th light emitting device groups A20 are arranged one by one in a direction from the first sub-display region Q11 towards the second sub-display region Q12. The first sub-display region Q11 and the second sub-display region Q12 are provided with M/2 first sub-pixel driving circuit groups A10, and the 1st to the (M/2)-th first sub-pixel driving circuit groups A10 are located in the first sub-display region Q11 and are sequentially arranged along a direction close to the mounting region Q3; the (M/2+1)-th to the M-th first sub-pixel driving circuit groups A10 are located in the second sub-display region Q12 and are sequentially arranged along a direction close to the mounting region Q3. The first electrodes D1 of the respective light emitting devices D in the i-th light emitting device group A20 in the mounting region Q3 are coupled to the pixel driving circuits 10 in the i-th first sub-pixel driving circuit group A10 in a one-to-one correspondence by signal connection lines, i having a value from 1 to M. For example, the pixel driving circuits 10 in the first sub-pixel driving circuit group A10, which is the first one (the one that is closest to the mounting region Q3) of the first sub-pixel driving circuit groups A10, in the first sub-display region Q11 are coupled in one-to-one correspondence to the first electrodes D1 of the light emitting devices D in the (M/2)-th light emitting device group A20 in the mounting region Q3.

It should be noted that, in the above connection manner, M is an even number, and when M is an odd number, the connection manner is as follows. In this case, the ((M+1)/2)-th first sub-pixel driving circuit group A10 may be disposed in the first sub-display region Q11, or the ((M+1)/2)-th first sub-pixel driving circuit group A10 may be disposed in the second sub-display region Q12, and the connection manner is the same as that described above, and the description thereof is not described here.

In some embodiments, the first sub-pixel driving circuit group A10 is disposed in each of the first and second sub-display regions Q11 and Q12, and a ratio of the closest distance among the distance(s) from at least one first sub-pixel driving circuit group A10 located in the first sub-display region Q11 to an edge of the mounting region Q3, to the closest distance among the distance(s) from at least one first sub-pixel driving circuit group A10 located in the second sub-display region Q12 to an edge of the mounting region Q3 is about 0.8 to 1.2. The outermost column or the outmost row of light emitting devices D in the mounting region Q3 is adjacent to a column or a row of light emitting devices D in the first display region closest to the mounting region Q3. Continuing to refer to FIG. 13, in some embodiments, the respective light emitting devices D located in the mounting region Q3 are electrically coupled to the pixel driving circuits 10 through signal connection lines. The signal connection lines coupled to the pixel driving circuits 10 in the 1st and the M-th first sub-pixel driving circuit groups A10 are disposed in the same layer (for example, in the second conductive layer), and are made of the same material, as the first plate of the storage capacitor Cst. For example, the signal connection lines to which the pixel driving circuits 10 in the 1st and the M-th first sub-pixel driving circuit groups A10 are coupled include a metal, such as molybdenum or an alloy of molybdenum. For example, the signal connection lines may have the same material as the first conductive layer. The pixel driving circuits 10 in the 1st and the M-th first sub-pixel driving circuit groups A10 may be coupled to the signal connection lines through via holes penetrating through the insulating layer, and the signal connection lines are coupled to the light emitting devices through via holes penetrating through the insulating layer. The signal connection line coupled to each of the pixel driving circuits 10 in the 2nd to the (M−1)-th first sub-pixel driving circuit groups A10 includes a transparent conductive material, for example, indium tin oxide.

In some embodiments, the signal connection line coupled to each of the pixel driving circuits 10 in the 2nd to the (M−1)-th first sub-pixel driving circuit groups A10 may be disposed in the same layer and made of the same material as the first electrode D1 of the light emitting device D. For example, the first electrode of the light emitting device D is an anode. The pixel driving circuits 10 in the 2nd to the (M−1)-th first sub-pixel driving circuit groups A10 may be coupled to the signal connection lines through via holes penetrating through the insulating layer, and the signal connection lines are directly coupled to the light emitting devices.

In some embodiments, the first sub-pixel driving circuit groups A10 located in the first and second sub-display regions Q11 and Q12 are uniformly arranged in the row direction X. For example, the first pixel driving circuit group includes, in addition to the first sub-pixel driving circuit group A10, a second sub-pixel driving circuit group positioned in the first sub-display region Q11 and the second sub-display region Q12, and the number of the second sub-pixel driving circuit groups between two adjacent first sub-pixel driving circuit groups A10 is the same.

In some embodiments, the number of first sub-pixel driving circuit groups A10 in the first display region Q1 is greater than the number of light emitting device groups A20 in the mounting region Q3, that is, some redundant pixel driving circuits 10 are present in the first display region Q1, so that repair can be performed when some pixel driving circuits 10 fail.

In some embodiments, in order to satisfy the wiring space of the data lines Vd coupled to the first sub-pixel driving circuit group, by compressing the pixel driving circuits 10 in the third and fourth sub-display regions Q13 and Q14 in the column direction Y to form a transition region Q4 between the first and second display regions Q1 and Q2 and surrounding the first display region Q1, the wiring space is reserved by the transition region Q4 for the data lines Vd coupled to the first sub-pixel driving line group A10. The data line Vd is a bend line in the transition region Q4, i.e., the portion of the bend line of the first data line Vd-1 in the transition region Q4 shown in FIG. 7.

In some embodiments, by compressing the pixel driving circuits 10 in the third sub-display region Q13 and the fourth sub-display region Q14 in the column direction Y, in the third sub-display region Q13 and the fourth sub-display region Q14, the distance between the reset power signal lines to which two adjacent pixel driving circuits 10 are coupled in the column direction Y is d3; in the second display region Q2, the distance between the reset power signal lines to which two adjacent pixel driving circuits 10 are coupled in the column direction Y is d4, and d3 is smaller than d4.

In some embodiments, in the first display region Q1, the width of at least some pixel driving circuits 10 in the row direction X is smaller than the width of at least some light emitting devices D in the row direction X. In an embodiment, the width of the pixel driving circuit 10 in the row direction X is, for example, the distance between adjacent data lines Vd, or the distance between respective positions of the same components of two pixel driving circuits 10; the width of the light emitting device D in the row direction X is, for example, the width of the first electrode D1 of the light emitting device D in the row direction X, the width of the light emitting layer of the light emitting device D in the row direction X, the width of the light emitting region of the light emitting device D in the row direction X, or the width of the opening of the pixel defining layer of the light emitting device D in the row direction X, or the width of the light emitting device D means one quarter of the distance between the light emitting devices of the same color in two light emitting units adjacently disposed in the row direction X.

For example, in a case where the width of the pixel driving circuits 10 in the row direction X refers to the distance between respective positions of the same components of two pixel driving circuits 10, and the width of the light emitting device D refers to one quarter of the distance between the light emitting devices of the same color in two light emitting units adjacently arranged in the X direction, in the first display region Q1, a difference between the width of any one pixel driving circuit 10 in the row direction X and the width of any one of the light emitting devices D in the row direction X is about 3 to 5 μm. The height or width of the pixel driving circuit 10 is smaller than the width or height of the light emitting device D in the first display region Q1, and the height or width of the pixel driving circuit 10 is the same as the width or height of the light emitting device D in the second display region Q2.

In some embodiments, since the photosensitive sensors are disposed in the mounting region Q3, the size of the light emitting device D in the mounting region Q3 is smaller than the size of the light emitting device D in each of the first display region Q1 and the second display region Q2. For example, the size of the light emitting device D refers to the area of the light emitting device D, such as the area of the anode, or the area of the light emitting region. For example, the display substrate further includes a pixel defining layer disposed on the substrate, the pixel defining layer includes pixel openings in one-to-one correspondence with the first electrodes D1 of the light emitting devices D, and in each of the first display region Q1, the second display region Q2, and the mounting region Q3, the pixel openings corresponding to the first electrodes D1 of the light emitting devices D emitting light with the same color have substantially the same size. For the pixel openings corresponding to the first electrodes D1 (for example, anodes) of the light emitting devices D emitting light with the same color, the size of the pixel opening in the mounting region Q3 is smaller than the size of the pixel opening in each of the first display region Q1 and the second display region Q2.

Figure 14:
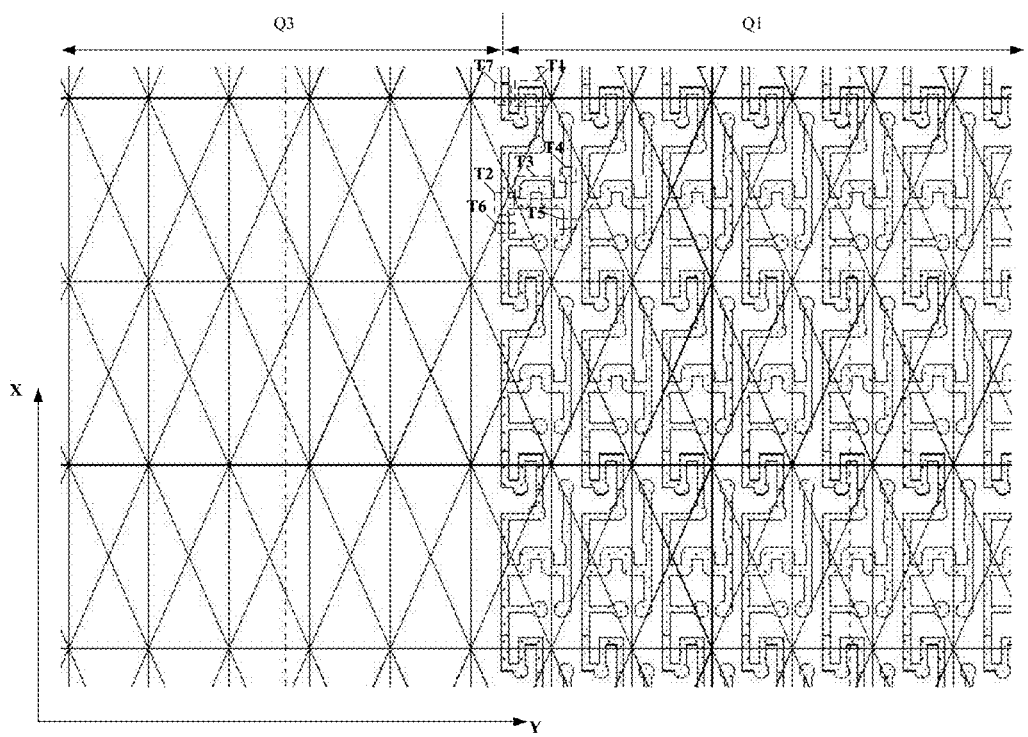
FIG. 14 is a schematic diagram of an active semiconductor layer of a display substrate according to an embodiment of the present disclosure.

In the embodiments of the present disclosure, in order to make the structures of the layers in the display substrate more apparent, the following description will be given by explaining each patterned layer in the display substrate in detail with reference to the layout of the patterned layer. For example, FIG. 14 is a schematic diagram of an active semiconductor layer of a display substrate according to an embodiment of the disclosure. As shown in FIG. 14, the active semiconductor layer 010 may be formed by patterning the semiconductor material. The active semiconductor layer 010 may be used to fabricate active layers of the driving transistor T3, the data writing transistor T4, the threshold compensation transistor T2, the first light emission control transistor T5, the second light emission control transistor T6, the first reset transistor T1, and the second reset transistor T7 described above. The active semiconductor layer 010 includes a pattern of an active layer (channel region) and a pattern of a doped region (source/drain doped region) of each transistor of each sub-pixel, and the pattern of the active layer and the pattern of the doped region of each transistor in the same pixel driving circuit 10 are formed as a single piece.

It should be noted that, the active semiconductor layer 010 is disposed on the substrate, a buffer layer is formed between the substrate and the active semiconductor layer 010, the active layer may include a low temperature polysilicon layer that is formed as a single piece, and the source region and the drain region may be conducted by doping to realize electric connection of respective structures. That is, the active semiconductor layer 010 of each transistor of each pixel driving circuit 10 is a single pattern formed of p-Si, and each transistor in the same pixel driving circuit 10 includes the pattern of the doped region (i.e., a source region and a drain region) and the pattern of the active layer, and active layers of different transistors are separated by the doped structure.

For example, the active semiconductor layer 010 may be made of amorphous silicon, polycrystalline silicon, an oxide semiconductor material, or the like. It should be noted that, the source region and the drain region may be regions doped with n-type impurities or p-type impurities.

For example, the active semiconductor layers 010 of the pixel driving circuits 10 arranged in the row direction X are disconnected from each other. The active semiconductor layers 010 of the pixel driving circuits 10 arranged in the column direction Y may be formed as a single piece or may be disconnected from each other.

Figure 15:
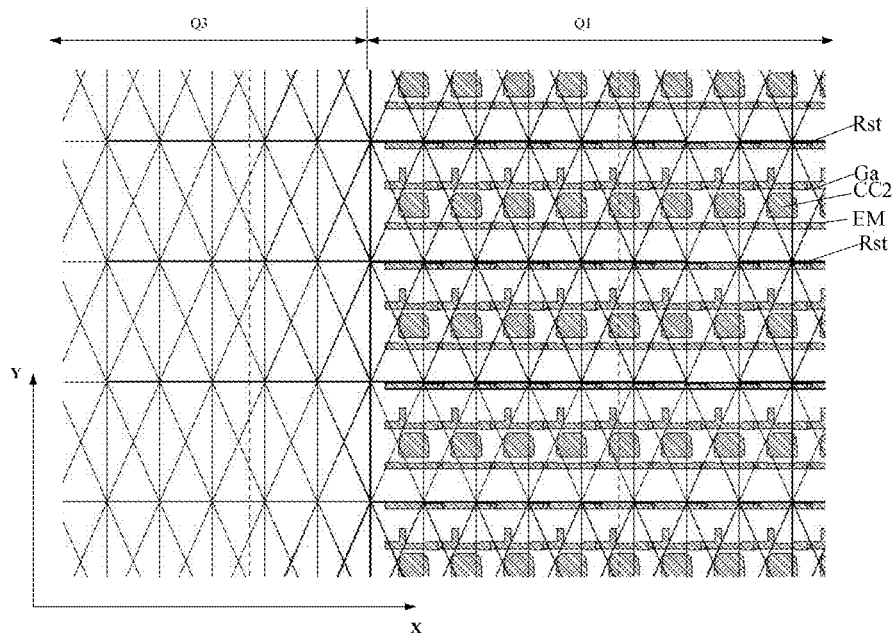
FIG. 15 is a schematic diagram of a first conductive layer of a display substrate according to an embodiment of the present disclosure.

For example, a gate insulating layer is formed on the active semiconductor layer 010. FIG. 15 is a schematic diagram of a first conductive layer of a display substrate according to an embodiment of the disclosure. As shown in FIG. 15, the display substrate includes a first conductive layer 020, and the first conductive layer 020 is disposed on a side of the gate insulating layer away from the active semiconductor layer 010, so as to be insulated from the active semiconductor layer 010. The first conductive layer 020 may include the second plate CC2 of the storage capacitor Cst, the scan signal line Ga, the reset control signal line Rst, the light emission control signal line EM, and the gate electrodes of the driving transistor T3, the data writing transistor T4, the threshold compensation transistor T2, the first light emission control transistor T5, the second light emission control transistor T6, the first reset transistor T1, and the second reset transistor T7. For example, the gate electrode of the data writing transistor T4 may be a portion of the scan signal line Ga overlapping with the active semiconductor layer 010; the gate electrode of the first light emission control transistor T5 may be a first portion of the light emission control signal line EM overlapping with the active semiconductor layer 010, and the gate electrode of the second light emission control transistor T6 may be a second portion of the light emission control signal line EM overlapping with the active semiconductor layer 010; the gate electrode of the first reset transistor T1 may be a first portion of the reset control signal line Rst overlapping with the active semiconductor layer 010, and the gate electrode of the second reset transistor T7 may be a second portion of the reset control signal line Rst overlapping with the active semiconductor layer 010; the threshold compensation transistor T2 may be a thin film transistor having a dual gate structure, a first gate electrode of the threshold compensation transistor T2 may be a portion of the scan signal line Ga overlapping with the active semiconductor layer 010, and a second gate electrode of the threshold compensation transistor T2 may be a portion of a protruding structure P, which protrudes from the scan signal line Ga, overlapping with the active semiconductor layer 010. The gate electrode of the driving transistor T3 may serve as the second plate CC2 of the storage capacitor Cst.

It should be noted that each dotted rectangular box in FIG. 14 shows each portion where the first conductive layer 020 overlaps with the active semiconductor layer 010. The active semiconductor layers 010 at both sides of a channel region of each transistor are conductized by a process of ion doping or the like to form source and drain electrodes of the transistor.

For example, as shown in FIG. 15, the scan signal lines Ga, the reset control signal lines Rst, and the light emission control signal lines EM are arranged in the column direction Y. The scan signal line Ga is located between the reset control signal line Rst and the light emission control signal line EM.

For example, in the column direction Y, the second electrode CC2 of the storage capacitor Cst (i.e., the gate electrode of the driving transistor T3) is located between the scan signal line Ga and the light emission control signal line EM. The protruding structure P protruding from the scan signal line Ga is located on a side of the scan signal line Ga away from the light emission control signal line EM.

For example, as shown in FIG. 14, in the column direction Y, the gate electrode of the first reset transistor T1, the gate electrode of the second reset transistor T7, the gate electrode of the data writing transistor T4, and the gate electrode of the threshold compensation transistor T2 are located on a first side of the gate electrode of the driving transistor T3, and the gate electrodes of the first light emission control transistor T5 and the second light emission control transistor T6 are located on a second side of the gate electrode of the driving transistor T3. For example, in the example shown in FIG. 12, the first side and the second side of the gate electrode of the driving transistor T3 of the pixel driving circuit 10 are two sides of the gate electrode of the driving transistor T3 which are opposite to each other in the second direction Y. For example, as shown in FIG. 14, the first side of the gate electrode of the driving transistor T3 of the pixel driving circuit 10 may be the lower side of the gate electrode of the driving transistor T3, and the second side of the gate electrode of the driving transistor T3 of the pixel driving circuit 10 may be the upper side of the gate electrode of the driving transistor T3. For example, the side of the display substrate for bonding the IC is the lower side of the display substrate, and the lower side of the gate electrode of the driving transistor T3 is the side of the gate electrode of the driving transistor T3 closer to the IC. The upper side is an opposite side of the lower side, for example, the upper side of the gate electrode of the driving transistor T3 is a side of the gate electrode of the driving transistor T3 away from the IC.

In some embodiments, as shown in FIG. 14, in the row direction X, the gate electrode of the second light emission control transistor T6, the gate electrode of the second reset transistor T7, and the first gate electrode of the threshold compensation transistor T2 are all located at the third side of the gate electrode of the driving transistor T3; and the gate electrode of the first light emission control transistor T5, the gate electrode of the data writing transistor T4, the gate electrode of the first reset transistor T1 are all located at the fourth side of the gate electrode of the driving transistor T3. For example, in the example shown in FIG. 14, the third side and the fourth side of the gate electrode of the driving transistor T3 of the pixel driving circuit 10 of the sub-pixel are two sides of the gate electrode of the driving transistor T3 which are opposite to each other in the row direction X. For example, as shown in FIG. 14, the third side of the gate electrode of the driving transistor T3 of the pixel driving circuit 10 may be the left side of the gate electrode of the driving transistor T3 of the pixel driving circuit 10, and the fourth side of the gate electrode of the driving transistor T3 of the pixel driving circuit 10 may be the right side of the gate electrode of the driving transistor T3 of the pixel driving circuit 10. The left and right sides are opposite sides. For example, for the data line Vd and the first power signal line VDD coupled to the same pixel driving circuit 10, the data line Vd is on the right side of the first power signal line VDD, and the first power signal line VDD is on the left side of the data line Vd.

It should be noted that the structure of pixel driving circuit 10 may be a mirror-image structure as shown in FIG. 14, that is, the structures of the layers of each pixel driving circuit 10 are symmetric with respect to the channel region of the driving transistor T3, and therefore, the left and right sides of the structures of the layers of each pixel driving circuit 10 may be reversed.

Figure 16:
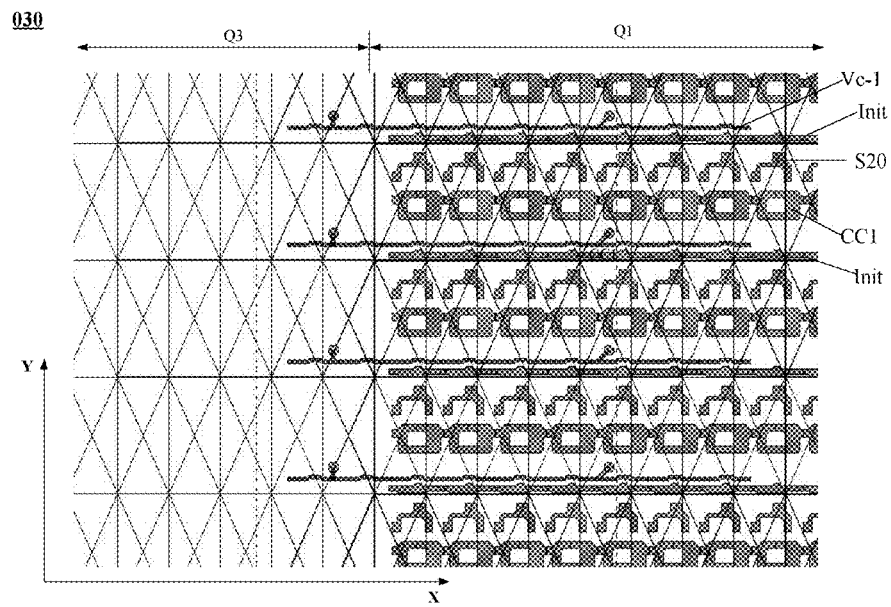
FIG. 16 is a schematic diagram of a second conductive layer of a display substrate according to an embodiment of the present disclosure.

For example, a first insulating layer is formed on the first conductive layer 020 to insulate the first conductive layer 020 from a second conductive layer 030 to be formed subsequently. FIG. 16 is a schematic diagram of a second conductive layer 030 of a display substrate according to an embodiment of the disclosure. As shown in FIG. 16, the second conductive layer 030 of the pixel driving circuit 10 includes a first transfer electrode Vd-14 and a second transfer electrode Vd-15 of the first data line Vd-1, a signal connection line Vc-1 coupled to the pixel driving circuits 10 of the 1st and the M-th first sub-pixel driving circuit groups A10, a first plate CC1 of the storage capacitor Cst, the reset power signal line Init, and a first light shielding pattern S20. The first plate CC1 of the storage capacitor Cst at least partially overlaps with the second plate CC2 of the storage capacitor Cst to form the storage capacitor Cst.

In some embodiments, as shown in FIG. 14, the active semiconductor layer 010 between two channel regions of the dual-gate threshold compensation transistor T2 is in a floating state when the threshold compensation transistor T2 is turned off, and a voltage of the active semiconductor layer 010 is apt to jump by the influence of a voltage on a peripheral conductive line, so that the leakage current of the threshold compensation transistor T2 is affected, and thus, the brightness of the emitted light is affected. In order to keep the voltage of the active semiconductor layer 010 between the two channel regions of the threshold compensation transistor T2 stable, the second light shielding pattern S20 and the active semiconductor layer 010 between the two channel regions of the threshold compensation transistor T2 are disposed to form a capacitor, and the second light shielding pattern S20 may be coupled to the first power signal line VDD to obtain a constant voltage, so that the voltage of the active semiconductor layer 010 in a floating state may be kept stable. The second light shielding pattern S20 overlaps with the active semiconductor layer 010 between the two channel regions of the dual-gate threshold compensation transistor T2, which may also prevent the active semiconductor layer 010 between the two gate electrodes from being irradiated so as to avoid a change of its characteristics, for example, prevent the voltage of the active semiconductor layer 010 from being changed so as to prevent crosstalk.

In one example, the first power signal line VDD to which each of the second light shielding patterns S20 is coupled is one of the plurality of first power signal lines VDD that is closest thereto in the row direction X. For example, the second light shielding pattern S20 for shielding the channel region of the threshold compensation transistor T2 in the second pixel driving circuit 10 is coupled to the first power signal line VDD on the left side thereof, which is also used to supply the first voltage to the first pixel driving circuit 10.

Figure 17:
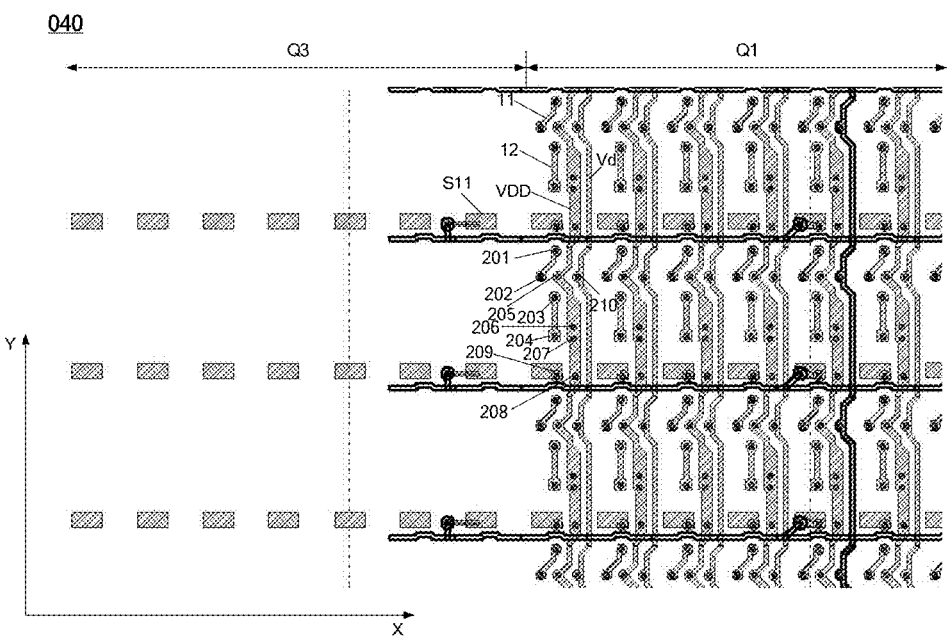
FIG. 17 is a schematic diagram of a third conductive layer of a display substrate according to an embodiment of the present disclosure.

For example, a second insulating layer is formed on the second conductive layer 030 described above to insulate the second conductive layer 030 described above from a first source/drain metal layer to be formed subsequently. FIG. 17 is a schematic diagram of a third conductive layer 040 of a display substrate according to an embodiment of the disclosure. As shown in FIG. 17, the first source-drain metal layer of the pixel driving circuit 10 includes a first sub data line segment Vd-11, a second sub data line segment Vd-12, a third sub data line segment Vd-13 and a first transfer portion S11 of a first data line Vd-1, a fourth sub data line segment Vd-16 and a fifth sub data line segment Vd-17 of a second data line Vd-2, a first power signal line VDD, and a portion of the data line Vd that is only located in the first display region Q1.

For example, the third conductive layer further includes a first connection portion 11 and a second connection portion 12. FIG. 17 also illustrates an exemplary location of a plurality of via holes through which the third conductive layer 040 is coupled to the plurality of film layers that are located between the source-drain metal layer and the substrate 101. For example, as shown in FIGS. 3 and 17, the data line Vd is electrically coupled to the drain electrode of the data writing transistor T4 through a via hole 210 penetrating through the gate insulating layer, the first insulating layer, and the second insulating layer. The power signal line VDD is electrically coupled to the source electrode of the first light emission control transistor T5 through a via hole 208 penetrating through the gate insulating layer, the first insulating layer, and the second insulating layer. The power signal lines VDD and the data lines Vd are alternately arranged in the row direction X. The power signal line VDD is electrically coupled to the first plate CC1 of the storage capacitor through via holes 206 and 207 penetrating through the second insulating layer. The first power signal line VDD extends in the column direction Y. The power signal line VDD is electrically coupled to the second light shielding pattern S20 through a via hole 205 penetrating through the second insulating layer 105 to supply a constant voltage to the second light shielding pattern S20. One end of the first connection portion 11 is electrically coupled to the reset power signal line Init through a via hole 208 penetrating through the first and second insulating layers, and the other end of the first connection portion 11 is electrically coupled to the drain electrode of the first transistor T1 and the source electrode of the seventh transistor T7 through a via hole 202 penetrating through the interlayer insulating layer, the first insulating layer, and the second insulating layer. One end of the second connection portion 12 is electrically coupled to the source electrode of the first transistor T1 through a via hole 203 penetrating through the gate insulating layer, the first insulating layer, and the second insulating layer, and the other end of the second connection portion 12 is electrically coupled to the second plate CC2 of the storage capacitor Cst through a via hole 204 penetrating through the first insulating layer and the second insulating layer.

Figure 18:
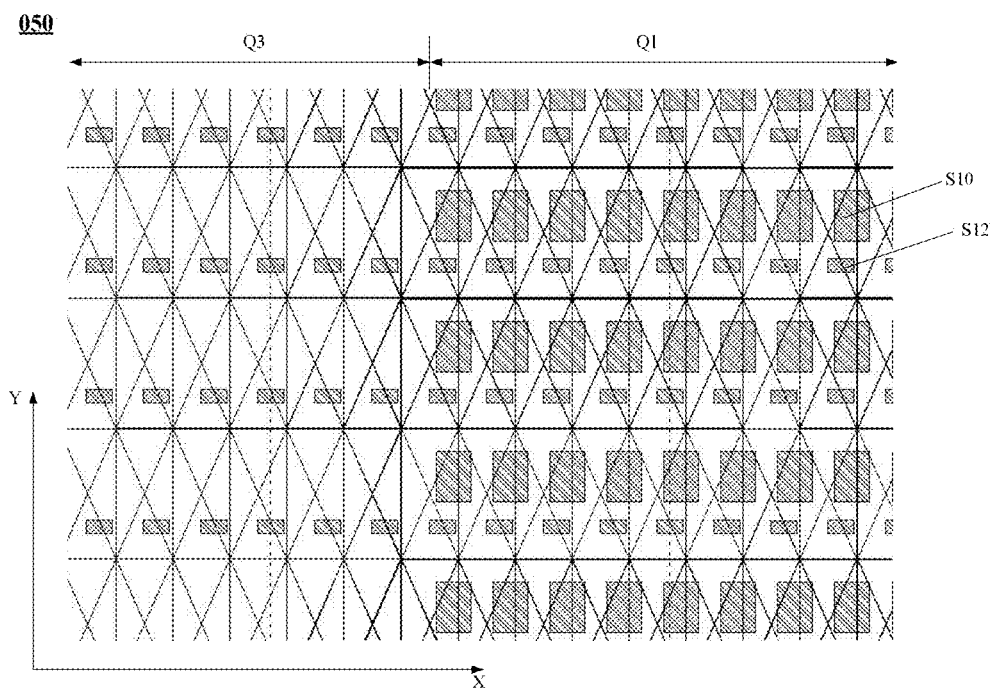
FIG. 18 is a schematic diagram of a fourth conductive layer of a display substrate according to an embodiment of the present disclosure.

For example, a third insulating layer is formed on the third conductive layer described above for insulating the third conductive layer 040 from the fourth conductive layer 050 which is formed subsequently. FIG. 18 is a schematic diagram of the fourth conductive layer 050 of the display substrate according to an embodiment of the disclosure. As shown in FIG. 18, the fourth conductive layer 050 includes a first light shielding portion S10 and a second transfer portion S12. The orthographic projection of the first light shielding portion S10 on the substrate at least partially overlaps with the orthographic projection of the active layer of the driving transistor T3 on the substrate; and the second transfer portion S12 is electrically coupled to the first transfer portion S11 through a via hole 209 penetrating through the third insulating layer.

Figure 19:
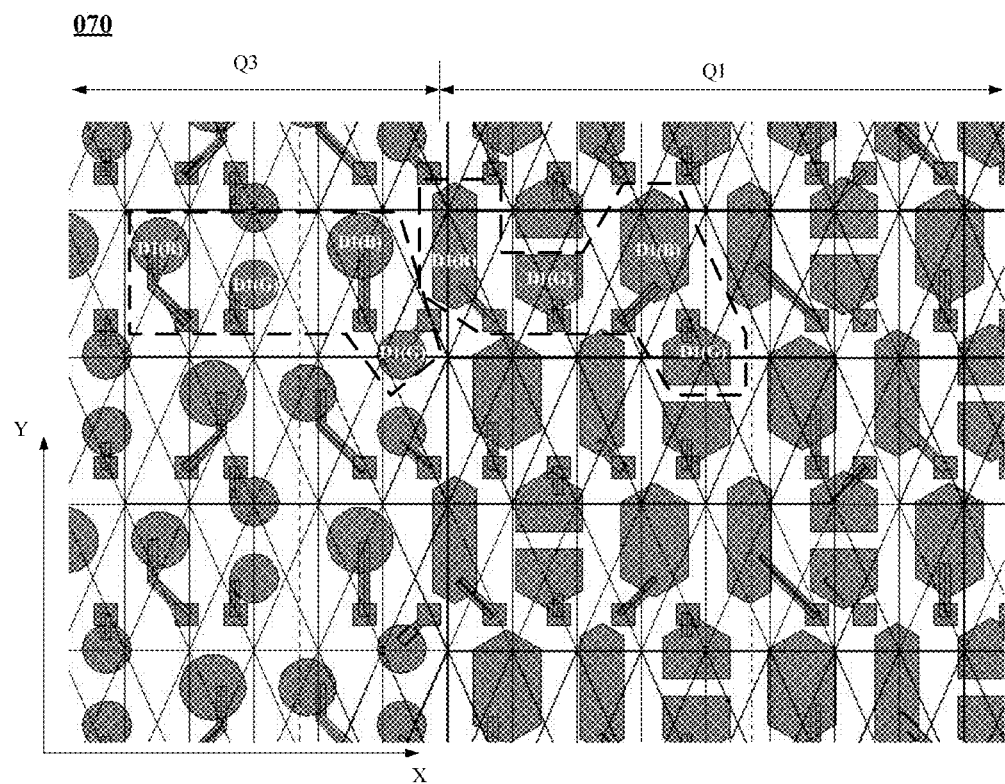
FIG. 19 is a schematic diagram of first electrodes of light emitting devices of a display substrate according to an embodiment of the present disclosure.

For example, a planarization layer is formed on the fourth conductive layer 050 to protect the fourth conductive layer 050 described above. A first electrode D1 of the light emitting device D is formed on the planarization layer 106, and the first electrode D1 of the light emitting device D is coupled to the second transfer portion S12. FIG. 19 is a schematic diagram of the first electrode (transparent conductive layer 070) of the light emitting device of the display substrate according to an embodiment of the disclosure. As shown in FIG. 19, the planarization layer includes a via hole 211, the first electrode D1 of each light emitting device D may be disposed on a side of the planarization layer away from the substrate, and the first electrode D1 of the light emitting device D is electrically coupled to the drain electrode of the second light emission control transistor T6 through the via hole. Of course, it should be understood that a signal connection line is further provided in the transparent conductive layer 070 for electrically coupling the first electrode D1 of the light emitting device D in the mounting region and the drain electrode of the second light emission control transistor T6.

Continuing to refer to FIG. 19, the sizes of the first electrodes D1(R) of the red light emitting devices in the first display region Q1 and the mounting region Q3 are substantially the same, and the size of the first electrode D1(R) of the red light emitting device in the first display region Q1 is larger than the size of the first electrode D1(R) of the red light emitting device in the mounting region Q3; the sizes of the first electrodes D1(B) of the green light emitting devices in the first display region Q1 and the mounting region Q3 are substantially the same, and the size of the first electrode D1(B) of the green light emitting device in the first display region Q1 is larger than the size of the first electrode D1(B) of the green light emitting device in the mounting region Q3.

In some embodiments, the light emitting device D may be an organic light emitting diode (OLED), or may also be an LED, and in the embodiments of the present disclosure, the description is given by taking a case where the light emitting device D is the OLED as an example. One of the first electrode D1 and the second electrode of the light emitting device D is an anode, and the other is a cathode.

An embodiment of the present disclosure also provides a display device, which includes the display substrate. It should be noted that, the display device provided in the embodiment may be any product or component with a display function, such as a flexible wearable device, a mobile phone, a tablet computer, a television, a display, a notebook computer, a digital photo frame, a navigator and the like. Other essential components of the display device should be understood by those of ordinary skill in the art, and are not described herein, and should not be construed as limiting the disclosure.

In some embodiments, the display device further includes: a photosensitive sensor, of which an orthographic projection on the substrate is located in the mounting region Q3. The mounting region Q3 is rectangular, and the area of the orthographic projection of the photosensitive sensor on the substrate is less than or equal to the area of the inscribed circle of the second display region Q2.

Further, the display device may also include various types of display devices, such as a liquid crystal display device, an organic light emitting (OLED) display device, and a tiny diode (mini LED) display device, which are not limited herein.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

What is claimed is:

1. A display substrate having a mounting region, a first display region adjacent to the mounting region, and a second display region surrounding the first display region and/or the mounting region, the display substrate comprising:

a substrate;
a driving circuit layer on the substrate and comprising a plurality of pixel driving circuits, the plurality of pixel driving circuits being in the first display region and the second display region, and an arrangement density of the pixel driving circuits in the second display region being less than an arrangement density of the pixel driving circuits in the first display region;
a plurality of light emitting devices in the mounting region, the first display region, and the second display region, a first electrode of one of the plurality of light emitting device being electrically coupled to a corresponding one of the plurality of pixel driving circuits, and the pixel driving circuit electrically coupled to the first electrode of the light emitting device in the mounting region being located in the first display region; and
a plurality of data lines, one of the plurality of pixel driving circuits being electrically coupled to one of the plurality of data lines, wherein
the plurality of data lines comprise a first data line;
the first data line comprises a first sub data line segment coupled to the pixel driving circuits for driving at least part of the light emitting devices in the mounting region, a second sub data line segment coupled to the pixel driving circuits for driving at least part of the light-emitting devices in the second display region, and a third sub data line segment coupled to the pixel driving circuits for driving at least part of the light-emitting devices in the first display region;
the second sub data line segment is coupled to the third sub data line segment;
the first sub data line segment is coupled to the second sub data line segment through a first transfer electrode;
the first transfer electrode extends along a first direction;
the first sub data line segment and the second sub data line segment extend approximately along a second direction; and
the first direction intersects with the second direction.

2. The display substrate of claim 1, wherein
the second sub data line segment comprises a first part and a second part on two opposite sides of the mounting region,
the first sub data line segment comprises a third part, a fourth part and a fifth part coupled to one another,
the third sub data line segment comprises a sixth part and a seventh part on the two opposite sides of the mounting region,
the first part is coupled to the third part through the first transfer electrode, and
the first transfer electrode is between the first part and the third part.

3. The display substrate of claim 2, wherein
the second part is coupled to the fifth part through a second transfer electrode, the second transfer electrode extends along the first direction, and the second transfer electrode is between the second part and the fifth part.

4. The display substrate of claim 3, wherein
the first part, the second part, the first transfer electrode, the second transfer electrode, the third part, and the fifth part are in the second display region, and
the fourth part, the sixth part, and the seventh part are in the first display region.

5. The display substrate of claim 4, wherein
the first part and the third part are parallel along the second direction;
the second part and the fifth part are parallel along the second direction;

the first part and the second part are in a same straight line,
the third part and the fifth part are in a same straight line, and
the sixth part and the seventh part are in a same straight line.

6. The display substrate of claim 5, wherein
the third sub data line segment and the first sub data line segment are parallel along the second direction.

7. The display substrate of claim 3, wherein
the sixth part is coupled to the seventh part sequentially through the first part, the first transfer electrode, the third part, the fourth part, the fifth part, the second transfer electrode, and the second part.

8. The display substrate of claim 3, wherein the first transfer electrode and the second transfer electrodes are in a first conductive layer, the first sub data line segment, the second sub data line segment, and the third sub data line segments are in a second conductive layer, and the second conductive layer is in a different layer from the first conductive layer.

9. The display substrate of claim 3, wherein
the first part and the third part are opposite to each other,
the third sub data line segment and the fourth part are opposite to each other,
the second part and the fifth part are opposite to each other, and
the first transfer electrode and the second transfer electrode are opposite to each other.

10. The display substrate of claim 3, wherein
a length of the first transfer electrode and a length of the second transfer electrode in the first direction are the same.

11. The display substrate of claim 4, wherein
a line width of the fourth part of the first data line in the first direction is smaller than a line width of other parts of the first data line except the fourth part in the first direction.

12. The display substrate of claim 1, wherein
the plurality of data lines further comprise a second data line;
the second data line comprises a fourth sub data line segment coupled to the pixel driving circuits for driving at least part of the plurality of light emitting devices in the first display region, a fifth sub data line segment coupled to the pixel driving circuits for driving at least part of the plurality of light-emitting devices in the second display region, and a sixth sub data line segment coupled to the pixel driving circuits for driving at least part of the plurality of light-emitting devices in the mounting region; and
the fourth sub data line segment, the fifth sub data line segment, and the sixth sub data line segment are coupled to one another.

13. The display substrate of claim 12, wherein
the fifth sub data line segment comprises an eighth part and a ninth part, the eighth part and the ninth part being in the second display region and spaced apart from each other by the first display region.

14. The display substrate of claim 13, wherein
the eighth part and the ninth part are in a same straight line, and
the fourth sub data line segment is not in the same straight line as the eighth part and the ninth part.

15. The display substrate of claim 14, wherein
at least part of the fourth sub data line segment and the sixth sub data line segments is in the first display region.

16. The display substrate of claim 12, wherein
the sixth sub data line segment and the fourth sub data line segments are opposite and parallel to each other.

17. The display substrate of claim 12, wherein
the fourth sub data line segment, the fifth sub data line segment, and the sixth sub data line segments extend in the second direction.

18. The display substrate of claim 12, wherein
a line width of the sixth sub data line segment of the second data line in the first direction is smaller than a line width of other parts of the second data line except the sixth sub data line segment in the first direction.

19. A display device, comprising the display substrate of claim 1.

20. The display device of claim 19, further comprising: a photosensitive sensor, wherein an orthographic projection of the photosensitive sensor on the substrate is in the mounting region.

* * * * *